US010105953B2

(12) United States Patent
Midorikawa

(10) Patent No.: US 10,105,953 B2
(45) Date of Patent: Oct. 23, 2018

(54) CLEANING DEVICE OF LIQUID EJECTION HEAD AND LIQUID EJECTION DEVICE

(71) Applicant: SII Printek Inc., Chiba-shi, Chiba (JP)

(72) Inventor: Masaru Midorikawa, Chiba (JP)

(73) Assignee: SII PRINTEK INC., Chiba (JP)

( * ) Notice: Subject to any disclaimer, the term of this patent is extended or adjusted under 35 U.S.C. 154(b) by 0 days.

(21) Appl. No.: 15/479,575

(22) Filed: Apr. 5, 2017

(65) Prior Publication Data

US 2017/0297339 A1 Oct. 19, 2017

(30) Foreign Application Priority Data

Apr. 14, 2016 (JP) ................................ 2016-081411
Dec. 19, 2016 (JP) ................................ 2016-244985

(51) Int. Cl.
*B41J 2/165* (2006.01)

(52) U.S. Cl.
CPC ....... *B41J 2/16538* (2013.01); *B41J 2/16541* (2013.01); *B41J 2/16544* (2013.01); *B41J 2/16547* (2013.01); *H05K 999/99* (2013.01)

(58) Field of Classification Search
CPC ......................... B41J 2/16538; B41J 2/16535; B41J 2/16541; B41J 2/16544; B41J 2/16547; B41J 2/1655; B41J 2/16552; B41J 2002/16558
See application file for complete search history.

(56) References Cited

U.S. PATENT DOCUMENTS 6,478,402 B1 * 11/2002 Greive ................ B41J 2/16532 347/30
9,162,465 B1 10/2015 Tamarez Gomez et al.
2007/0222815 A1 * 9/2007 Kusakari ................ B41J 2/165 347/29

FOREIGN PATENT DOCUMENTS

JP H07-290715 A 11/1995
JP 2001-199076 A 7/2001
JP 2005-199597 A 7/2005
JP 2012-143947 A 8/2012
JP 2013-144460 A 7/2013

OTHER PUBLICATIONS

Extended European Search Report in corresponding European Application No. 17166601.9, dated Aug. 31, 2017, 4 pages.

* cited by examiner

*Primary Examiner* — Juanita D Jackson
(74) *Attorney, Agent, or Firm* — Brinks Gilson & Lione

(57) ABSTRACT

A cleaning device includes a blade unit configured to move relative to an ink jet head and to wipe an ejection surface of the ink jet head. The blade unit includes a first blade and a second blade that are arranged in a moving direction of the blade unit and formed into flexible plate shapes and a blower that makes an inner space, which is defined by the first blade and the second blade, into a negative pressure.

13 Claims, 21 Drawing Sheets

CLEANING DEVICE OF LIQUID EJECTION HEAD AND LIQUID EJECTION DEVICE

RELATED APPLICATIONS

This application claims priority under 35 U.S.C. § 119 to Japanese Patent Applications No. 2016-081411 filed on Apr. 14, 2016 and No. 2016-244985 filed on Dec. 19, 2016, the entire content of which is hereby incorporated by reference.

BACKGROUND OF THE INVENTION

Technical Field

The present invention relates to a cleaning device of a liquid ejection head and a liquid ejection device.

Related Art

An ink jet printer includes an ink jet head that reciprocates in a main scanning direction and a conveyance mechanism that conveys a printing medium (such as a sheet of paper) in a sub scanning direction which is perpendicular to the main scanning direction. The ink jet head ejects ink droplets via nozzle holes in the course of reciprocation in the main scanning direction. The ink droplets are impacted on the printing medium to print a variety of information on the printing medium.

The ink jet printer is provided with a cleaning device that cleans a surface in which the nozzle holes are opened (hereinafter referred to as an ejection surface) in the ink jet head in order to maintain or recover ejection performance of the nozzle holes. For example, JP 2012-143947 A discloses a wiping unit which includes a base coming in contact with an ejection surface and a suction channel formed in the base.

According to this configuration, by bringing the wiping unit into sliding contact with the ejection surface of the ink jet head, it is possible to suction and wipe ink attached to the ejection surface.

SUMMARY OF THE INVENTION

However, in the configuration disclosed in JP 2012-143947 A, since the suction channel is formed in the base, there is a problem in that it is difficult to machine the base and manufacturing costs increase.

An aspect of the invention provides a cleaning device of a liquid ejection head and a liquid ejection device that can achieve improvement in machining easiness and a decrease in costs.

To solve the problem, a cleaning device of a liquid ejection head according to an aspect of the invention includes: a blade unit configured to move relative to the liquid ejection head and to wipe an ejection surface in which ejection holes are opened in the liquid ejection head, wherein the blade unit includes a first blade and a second blade that are arranged in a moving direction of the blade unit and formed into flexible plate shapes, and a suction mechanism that makes an inner space, which is defined by the first blade and the second blade, into a negative pressure.

According to this aspect, by bringing the first blade and the second blade into sliding contact with the ejection surface in a state in which the inner space defined by the first blade and the second blade is kept at a negative pressure, it is possible to wipe the ejection surface while suctioning liquid attached to the first blade and the second blade or the ejection surface into the inner space. Accordingly, it is possible to satisfactorily remove liquid attached to the ejection surface and to maintain ejection performance of the liquid ejection head.

Particularly, by causing the first blade and the second blade to define the inner space, it is possible to improve machining easiness and to achieve a decrease in costs in comparison with a configuration in which a suction channel is formed in a base as in the related art.

In the aspect, the blade unit may be configured such that tips of the first blade and the second blade come in contact with each other so as to close the inner space at the time of non-wiping, while the tips of the first blade and the second blade are separated from each other so as to open the inner space with bending deformation at the time of wiping.

According to this aspect, since the inner space is opened with bending deformation at the time of wiping, it is possible to prevent foreign substance or the like from invading the inner space at the time of non-wiping. Accordingly, it is possible to improve maintenance of the blade unit.

In the aspect, the blade unit may be movable between a wiping position at which the first blade and the second blade are capable of wiping the ejection surface and a separating position at which the first blade and the second blade are separated apart from the ejection surface.

According to this aspect, the first blade and the second blade are movable between the wiping position and the separating position. Accordingly, when the blade unit is returned to a position before the wiping after the ejection surface is wiped, it is possible to suppress interference of the blade unit with the liquid ejection head. As a result, it is possible to prevent liquid attached to the first blade and the second blade, for example, in a wiping operation from being attached again to the liquid ejection head at the time of returning.

In the aspect, the blade unit may further include a blade pool in which a cleaning solution is contained, and the first blade and the second blade may be immersed in the cleaning solution at the separating position.

According to this aspect, by immersing the first blade and the second blade in the cleaning solution in the blade pool at the immersing position, it is possible to clean the first blade and the second blade and to remove liquid or the like attached to the first blade and the second blade.

In the aspect, the blade unit may further include a shutter mechanism that opens the blade pool at the wiping position and closes the blade pool in a state in which the first blade and the second blade are immersed in the cleaning solution at the separating position.

According to this aspect, by closing the blade pool using the shutter mechanism, for example, it is possible to suppress volatilization of the cleaning solution. For example, when UV-curable ink is used, it is possible to prevent UV light emitted after ejection of ink from entering the blade pool. Accordingly, it is possible to prevent ink mixed into the cleaning solution or ink attached to the blades from being cured in a UV light irradiation process after ejection of ink.

In the aspect, a float sensor that detects a liquid level of the cleaning solution contained in the blade pool may further be included.

According to this aspect, since the float sensor that detects a liquid level of the cleaning solution is provided, it is possible to keep the cleaning solution at a desired liquid level. Accordingly, it is possible to satisfactorily remove liquid or the like attached to the first blade and the second blade at the separating position.

In the aspect, the blade unit may further include: a blade frame that supports the first blade and the second blade and defines a suction chamber; and a connecting portion that connects the inner space to the suction chamber so as to communicate with each other, and the suction mechanism may be disposed in the blade frame and make the inner space into a negative pressure via the suction chamber and the connecting portion.

According to this aspect, by causing the suction mechanism to make the inner space into a negative pressure using the suction chamber and the connecting portion, it is possible to store suctioned liquid or the like in the suction chamber and to reduce, for example, a maintenance frequency.

In the aspect, the blade unit may be configured such that the inner space and the suction chamber communicate with each other via the connecting portion at the wiping position and the communication of the inner space and the suction chamber via the connecting portion is intercepted at the separating position.

According to this aspect, since the communication of the inner space and the suction chamber via the connecting portion is intercepted at the separating position, it is possible to prevent the cleaning solution in the blade pool from flowing into the inner space.

In the aspect, the blade frame may be provided with a baffle plate that is disposed between the connecting portion and the suction mechanism in the suction chamber.

According to this aspect, by disposing the baffle plate between the connecting portion and the suction mechanism, liquid or the like flowing into the suction chamber via the connecting portion collides with the baffle plate in the course of flowing into the suction mechanism. Accordingly, it is possible to prevent liquid or the like flowing into the suction chamber from being attached to the suction mechanism or being discharged to the outside of the blade frame via the suction mechanism. As a result, it is possible to collect liquid or the like flowing into the suction chamber in the suction chamber and to efficiently store the liquid or the like in the suction chamber.

In the aspect, a plurality of the liquid ejection heads may be arranged in a first direction perpendicular to the moving direction in a tangential direction of the ejection surface and are mounted on a carriage, and the first blade and the second blade may be disposed so as to correspond to the plurality of liquid ejection heads.

According to this aspect, since the first blade and the second blade are provided to correspond to each liquid ejection head, it is possible to satisfactorily wipe the ejection surface of each liquid ejection head.

In the aspect, the plurality of liquid ejection heads may be arranged in a first direction perpendicular to the moving direction in a tangential direction of the ejection surface and are mounted on a carriage, and a length in the first direction of at least one of the first blade and the second blade may be set to simultaneously wipe the plurality of liquid ejection heads.

According to this aspect, it is possible to achieve a decrease in the number of components or simplification in a configuration in comparison with a case in which the first blade and the second blade are provided for each liquid ejection head.

In the aspect, a cap unit that caps the ejection holes may further be included, wherein the blade unit and the cap unit may be movable together in a sub scanning direction intersecting a main scanning direction of the liquid ejection head.

According to this aspect, the ejection surface of the liquid ejection head can be wiped by the blade unit in the course of movement of the blade unit and the cap unit in the sub scanning direction. Particularly, in comparison with a configuration in which the blade unit and the cap unit are arranged in the main scanning direction as in the related art, it is possible to decrease the size in the main scanning direction of the liquid ejection device. In this case, even when the blade unit is provided to correspond to a plurality of liquid ejection heads arranged in the main scanning direction, it is possible to suppress an increase in size of the liquid ejection device. Accordingly, it is possible to provide a liquid ejection device with a small size and with a short cleaning time.

In the aspect, a degree of pressing of the blade unit to the ejection surface in a normal direction of the ejection surface at the time of wiping may be set to range from 0.5 mm to 3.0 mm from the ejection surface.

According to this aspect, since an appropriate pressing force can be applied from the blade unit to the ejection surface by setting the degree of pressing to 0.5 mm or more, it is possible to effectively wipe the ejection surface. On the other hand, by setting the degree of pressing to 3.0 mm or less, it is possible to prevent the pressing force acting on the ejection surface from increasing excessively and to achieve extension of a lifespan of the liquid ejection head or the blade unit.

A liquid ejection device according to an aspect of the invention includes a liquid ejection head that is movable in a main scanning direction and the cleaning device according to any one of the above-mentioned aspects.

According to this aspect, since the cleaning device according to the above-mentioned aspects is employed, it is possible to provide a liquid ejection device with high reliability at a low cost.

According to one aspect of the invention, it is possible to achieve improvement in machining easiness and a decrease in costs.

DETAILED DESCRIPTION OF THE INVENTION

Figure 1:
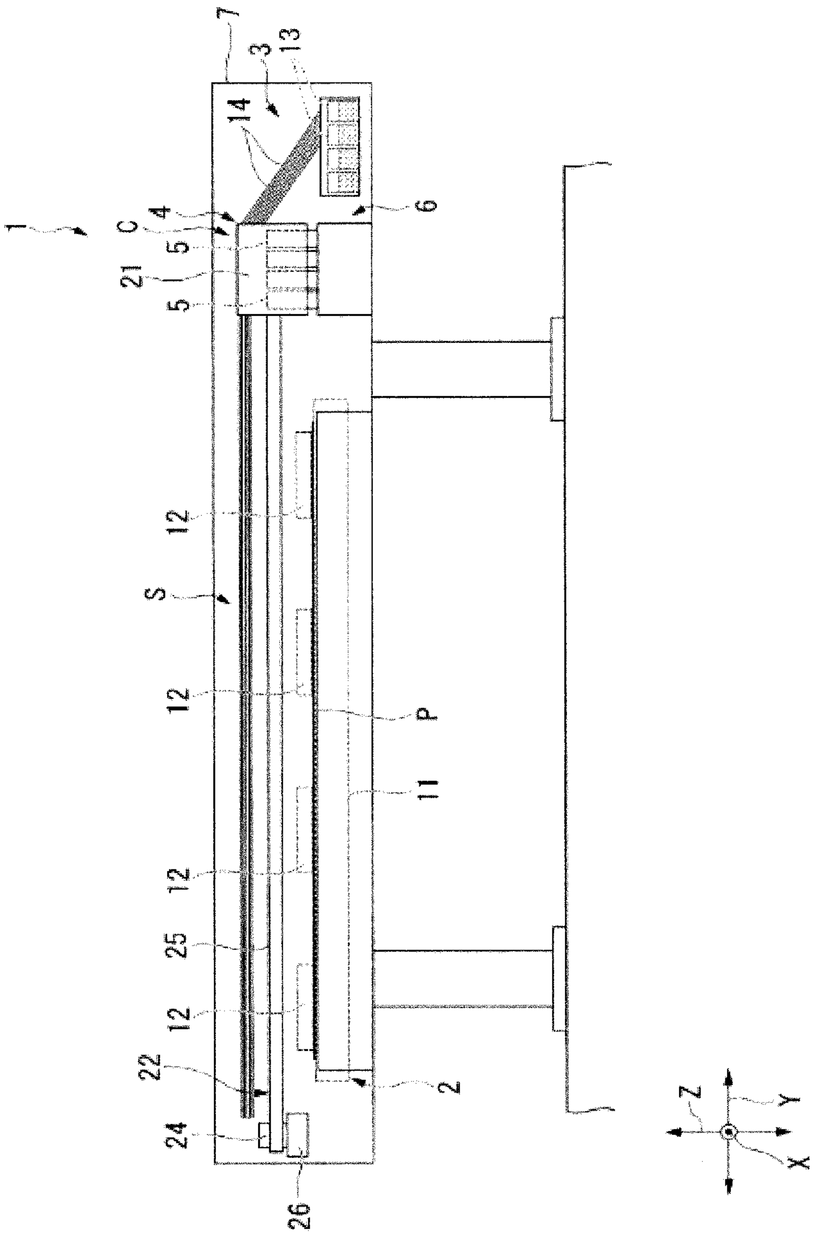
FIG. 1 is a schematic configuration diagram of a printer according to a first embodiment.

Hereinafter, embodiments of the invention will be described with reference to the accompanying drawings. In the following description, an ink jet printer (hereinafter simply referred to as a printer) that performs a printing operation on a printing medium using ink will be described as an example of a liquid ejection device including a cleaning device of a liquid ejection head according to an aspect of the invention. In the drawings which are used for the following description, scales of elements are appropriately changed for the purpose of easy recognition of the elements.

First Embodiment

[Printer]

FIG. 1 is a schematic configuration diagram of a printer 1 according to a first embodiment of the invention.

As illustrated in FIG. 1, the printer 1 is a large-scale printer 1 which is used, for example, in industries. The printer 1 includes a conveyance mechanism 2, an ink supply mechanism 3, a scanning mechanism 4, an ink jet head 5, and a cleaning device 6. Reference numeral 7 denotes a housing constituting an outline of the printer 1. The housing 7 receives the above-mentioned components.

In the following description, an orthogonal coordinate system of X, Y, and Z will be described as needed. In this case, an X direction is parallel to a conveyance direction (a sub scanning direction) of a printing medium P (such as a sheet of paper). A Y direction is parallel to a scanning direction (a main scanning direction) of the ink jet head 5. A Z direction (a first direction) is parallel to a height direction perpendicular to the X direction and the Y direction.

The conveyance mechanism 2 conveys a printing medium P in the X direction. Specifically, the conveyance mechanism 2 includes a grit roller 11 that is disposed to extend in the Y direction, a pinch roller 12 that is disposed to extend in parallel to the grit roller 11, and a driving mechanism (not illustrated) such as a motor that causes the grit roller 11 to axially rotate.

The ink supply mechanism 3 includes an ink tank 13, an ink pipe 14 that connects the ink tank 13 to the ink jet head 5, and a supply pump (not illustrated) that supplies ink in the ink tank 13 to the ink jet head 5.

A plurality of ink tanks 13 are arranged in the Y direction. The ink tanks 13 separately contain a plurality of types of ink (four types in this embodiment) having different colors such as yellow, magenta, cyan, and black. The number of types of ink is not limited to four, but can be appropriately changed.

The ink pipe 14 is, for example, a flexible hose having flexibility. The ink pipe 14 separately connects the ink tanks 13 to the ink jet head 5.

The supply pump pressurizes the inside of the ink pipe 14 and sends out ink to the ink jet head 5 via the ink pipe 14.

The scanning mechanism 4 causes the ink jet head 5 to reciprocate in the Y direction. Specifically, the scanning mechanism 4 includes a carriage 21 on which the ink jet head 5 is mounted and a driving mechanism 22 that causes the carriage 21 to move in the Y direction.

The driving mechanism 22 includes a pair of pulleys 24 (only one pulley 24 is illustrated in FIG. 1) that are disposed with a gap in the Y direction, an endless belt 25 that is suspended between the pair of pulleys 24, and a driving motor 26 that rotationally drives one pulley 24.

The carriage 21 is configured to be movable on a guide rail which is not illustrated and which extends in the Y direction. A plurality of ink jet heads 5 are mounted on the carriage 21. In the illustrated example, a plurality of (four in this embodiment) ink jet heads 5 that separately eject different colors of ink such as yellow, magenta, cyan, and black are mounted on the carriage 21.

<Ink Jet Head>

Figure 2:
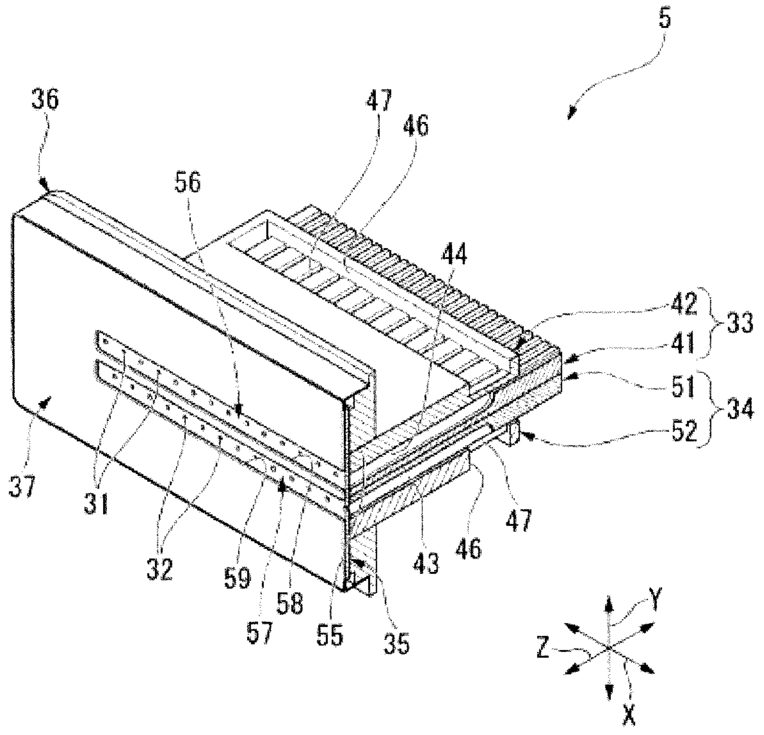
FIG. 2 is a perspective view of an ink jet head according to the first embodiment.
Figure 3:
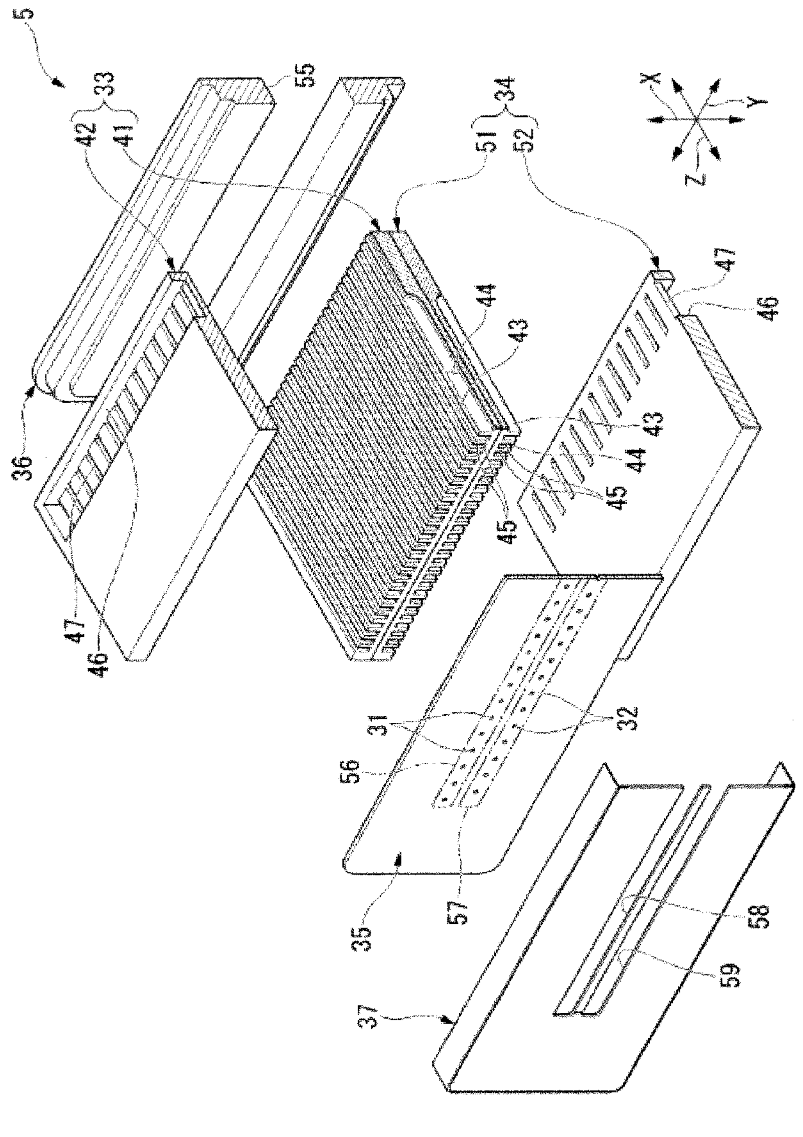
FIG. 3 is an exploded perspective view of the ink jet head according to the first embodiment.

The ink jet head 5 will be described below. FIG. 2 is a perspective view of one ink jet head 5. FIG. 3 is an exploded perspective view of the ink jet head 5. The ink jet heads 5 have the same configuration except for the color of ink supplied. Accordingly, only one ink jet head 5 will be described below and description of the other ink jet heads 5 will not be given.

As illustrated in FIGS. 2 and 3, the ink jet head 5 is a double-line ink jet head 5 in which a plurality of nozzle holes 31 and 32 ejecting ink are formed in two lines.

The ink jet head 5 roughly includes a first head tip 33, a second head tip 34, a nozzle plate 35, a nozzle cap 36, and a nozzle guard 37. In the following description, a side close to the nozzle plate 35 with respect to the head tips 33 and 34 in the Z direction is defined as a downside and a side apart from the nozzle plate 35 with respect to the head tips 33 and 34 is defined as an upside.

The first head tip 33 is of a so-called edge shoot type in which ink is ejected from an edge in a channel extending direction (the Z direction) in an ejection channel 43 to be described later.

The first head tip 33 has a configuration in which a first actuator plate 41 and a first cover plate 42 are stacked in the Y direction.

The first actuator plate 41 is a so-called monopole plate in which a polarization direction is set to one direction of the thickness direction (the Y direction). A ceramic plate formed of, for example, lead zirconate titanate (PZT) is suitably used as the first actuator plate 41. The first actuator plate 41 may be formed by stacking two piezoelectric plates in which the polarization directions are different in the Z direction (a so-called chevron type).

A plurality of channels 43 and 44 are arranged with a gap in the X direction on the surface of the first actuator plate 41 (a surface facing the first cover plate 42). The channels 43 and 44 are formed in a linear shape in the Z direction and are opened in at least a bottom end face of the first actuator plate 41. The channels 43 and 44 are partitioned in the X direction by driving walls 45 formed in the first actuator plate 41.

The plurality of channels 43 and 44 include ejection channels 43 which are filled with ink and non-ejection channels 44 which are not filled with ink. The ejection channels 43 and the non-ejection channels 44 are alternately arranged in the X direction. Drive electrodes which are not illustrated are formed on the inner surfaces (the driving walls 45) of the channels 43 and 44 by deposition or the like. The drive electrodes deform the driving walls 45 by a piezoelectric slip effect by applying a drive voltage thereto via a flexible printed board which is not illustrated.

The first cover plate 42 has a rectangular shape in a plan view when viewed in the Y direction. The first cover plate 42 is bonded to the surface of the first actuator plate 41 in a state in which a top end of the first actuator plate 41 is exposed.

The first cover plate 42 includes a common ink chamber 46 and a plurality of slits 47.

The common ink chamber 46 is formed at a position corresponding to top ends of the ejection channels 43 in the Z direction. The common ink chamber 46 is recessed toward the rear surface (a surface facing the first actuator plate 41) of the first cover plate 42 and extends in the X direction. Ink flows into the common ink chamber 46 via the ink supply mechanism 3 (see FIG. 1).

The slits 47 are formed at positions corresponding to the ejection channels 43 in the Y direction in the common ink chamber 46. The slits 47 cause the inside of the common ink chamber 46 to separately communicate with the ejection channels 43. On the other hand, the non-ejection channels 44 do not communicate with the common ink chamber 46.

The second head tip 34 has a configuration in which a second actuator plate 51 and a second cover plate 52 are stacked in the Y direction. The head tips 33 and 34 are unified by bonding the rear surfaces of the first actuator plate 41 and the second actuator plate 51. In the following description, the same elements of the second head tip 34 as in the first head tip 33 may be referenced by the same reference numerals as in the first head tip 33 and description thereof may not be repeated.

The ejection channels 43 and the non-ejection channels 44 of the second head tip 34 are arranged with a difference of a half pitch from the arrangement pitch of the ejection channels 43 and the non-ejection channels 44 of the first head tip 33. That is, the ejection channels 43 of the head tips 33 and 34 are arranged in a zigzag shape and the non-ejection channels 44 of the head tips 33 and 34 are arranged in a zigzag shape. In this case, the ejection channels 43 of the first head tip 33 and the non-ejection channels 44 of the second head tip 34 face each other in the Y direction, and the non-ejection channels 44 of the first head tip 33 and the ejection channels 43 of the second head tip 34 face each other in the Y direction. The arrangement pitch of the ejection channels 43 and the non-ejection channels 44 in the head tips 33 and 34 can be appropriately changed. That is, the ejection channels 43 in the head tips 33 and 34 may be formed at a corresponding position or at different positions in the X direction, the non-ejection channels 44 may also be formed at a corresponding position or at different positions in the X direction.

The nozzle cap 36 is a plate-shaped member having a rectangular outer shape in a plan view when viewed in the Z direction. A fitting hole 55 penetrating the nozzle cap 36 in the Z direction is formed in the nozzle cap 36. The first head tip 33 and the second head tip 34 are fitted into the fitting hole 55 together. In the example illustrated in FIG. 3, the head tips 33 and 34 are fitted into the fitting hole 55 such that the bottom end surfaces thereof are flush with the bottom end surfaces of the nozzle cap 36.

As illustrated in FIG. 3, the nozzle plate 35 is fixed to the bottom end surfaces of the head tips 33 and 34 and the nozzle cap 36, for example, by adhesion or the like. The nozzle plate 35 is formed in a single-layered structure or a multilayered structure out of a resin material (such as polyimide, a metal material (such as SUS), or glass. The thickness of the nozzle plate 35 is set to, for example, about 50 μm.

A plurality of nozzle arrays (a first nozzle array 56 and a second nozzle array 57) extending in the Y direction are formed in the nozzle plate 35. The nozzle arrays 56 and 57 extend in parallel with each other with a gap in the X direction.

The first nozzle array 56 includes a plurality of first nozzle holes 31 penetrating the nozzle plate 35 in the Z direction. The first nozzle holes 31 are separately formed at positions of the nozzle plate 35 facing the ejection channels 43 of the first head tip 33 in the Z direction. That is, the first nozzle holes 31 are arranged in a linear shape at intervals in the Y direction.

The second nozzle array 57 includes a plurality of second nozzle holes 32 penetrating the nozzle plate 35 in the Z direction. The second nozzle holes 32 are separately formed at positions of the nozzle plate 35 facing the ejection channels 43 of the second head tip 34 in the Z direction. That is, the second nozzle holes 32 are arranged in a linear shape at intervals in the Y direction. The nozzle holes 31 and 32 are formed in a taper shape with a diameter gradually decreasing from the top to the bottom.

As illustrated in FIGS. 2 and 3, the nozzle guard 37 is formed by performing pressing on a plate of, for example, SUS. The nozzle guard 37 has a box shape which is opened upward. The nozzle guard 37 is externally fitted to the nozzle cap 36 and covers the nozzle plate 35 from the downside.

Exposure holes (a first exposure hole 58 and a second exposure hole 59) penetrating the nozzle guard 37 in the Z direction are formed in portions of the nozzle guard 37 facing the nozzle arrays 56 and 57 in the Z direction. Each of the exposure holes 58 and 59 is formed in a slit shape extending in the Y direction. The nozzle arrays 56 and 57 are exposed to the outside via the corresponding exposure holes 58 and 59.

The bottom surface of the nozzle guard 37 and portions of the nozzle plate 35 exposed via the exposure holes 58 and 59 constitute an ejection surface of the ink jet head 5. In the ink jet head 5 according to this embodiment, since the nozzle plate 35 is covered with the nozzle guard 37, the nozzle holes 31 and 32 are opened at a position which is recessed upward from the bottom surface of the nozzle guard 37. That is, the ejection surface in this embodiment is an uneven surface including a convex surface formed of the bottom surface of the nozzle guard 37 and a concave surface formed of the bottom surface of the nozzle plate 35.

Figure 4:
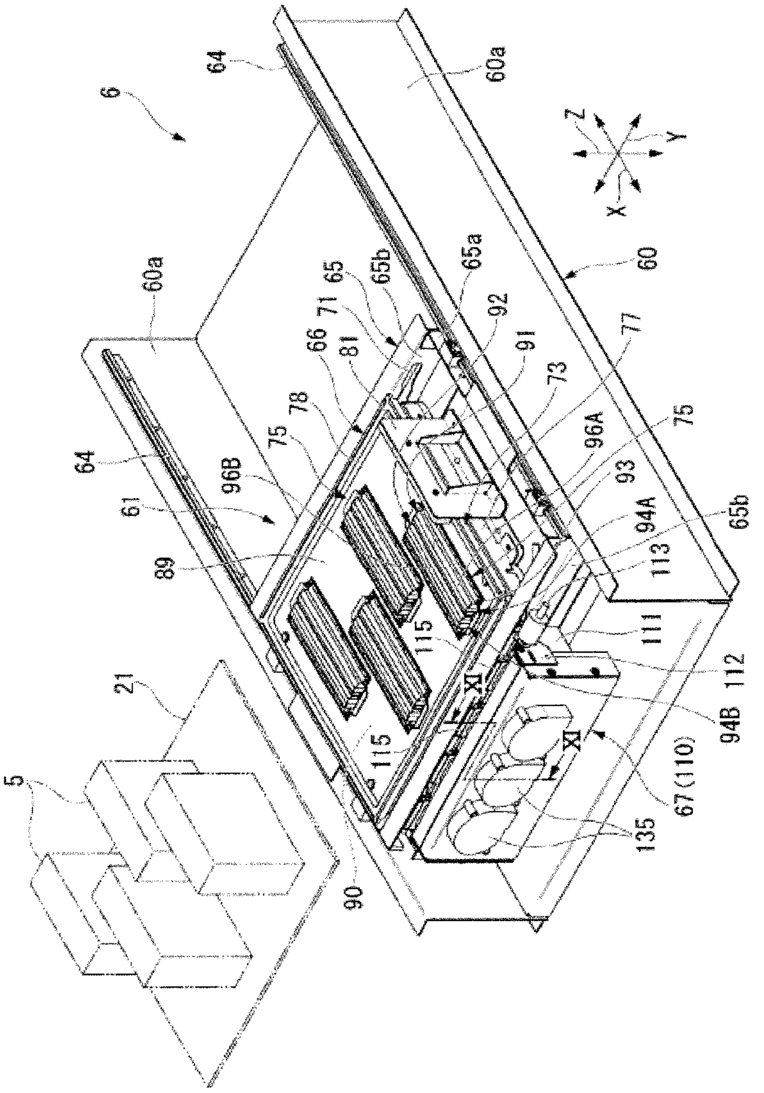
FIG. 4 is a perspective view of a cleaning device according to the first embodiment.

FIG. 4 is a perspective view of the cleaning device 6.

In the printer 1 according to this embodiment, as illustrated in FIG. 4, a plurality of ink jet heads 5 are mounted on the carriage 21 in a state in which the ink jet heads are arranged in a zigzag shape. In this case, in the ink jet heads 5 adjacent to each other in the Y direction, the nozzle arrays 56 and 57 partially lap each other when viewed in the Y direction. The layout of the ink jet heads 5 can be appropriately modified. For example, the ink jet heads 5 may be arranged such that the entire nozzle arrays 56 and 57 of the ink jet heads 5 lap each other when viewed in the Y direction. The number of ink jet heads 5 mounted on the carriage 21 can be appropriately changed.

As illustrated in FIG. 1, the ink jet head 5 moves between a printing area S and a cleaning area C with movement of the carriage 21 in the Y direction. The printing area S is an area above the printing medium P (the conveyance mechanism 2). The ink jet head 5 reciprocates in the Y direction in the printing area S when a printing operation on the printing medium P is performed.

The cleaning area C is an area located on one side of the printing area S in the Y direction. The ink jet head 5 moves to the cleaning area C at the time of maintenance or driving stop.

<Cleaning Device>

As illustrated in FIG. 4, the cleaning device 6 is disposed in the cleaning area C below the ink jet heads 5. Specifically, the cleaning device 6 includes a base frame 60, a cleaning unit 61, a cleaning solution supply mechanism 62 (see FIG. 12), and a cleaning solution tank 63 (see FIG. 12).

The base frame 60 supports the cleaning unit 61 to be movable in the X direction. The base frame 60 is formed in a C shape which is opened upward in a front view when viewed in the X direction. In the base frame 60, a base guide rail 64 is disposed in a pair of base side wall portions 60*a* facing each other in the Y direction. The base guide rail 64 extends in the X direction at top end portions of each base side wall portion 60*a*.

The cleaning unit 61 is disposed inside the base frame 60. The cleaning unit 61 includes a unit frame 65, a cap unit 66, and a blade unit 67.

The unit frame 65 is formed in a box shape which is opened upward. In the unit frame 65, a pair of first side wall portions 65*a* facing each other in the Y direction is supported on the base guide rails 64 to be slidable in the X direction.

The cleaning unit 61 is configured to be movable in the X direction relative to the base frame 60 by an operation of a driving mechanism which is not illustrated. Specifically, the cleaning unit 61 moves between an opposing position at which the cleaning unit overlaps the ink jet heads 5 located in the cleaning area C and a retracting position (see FIG. 15) at which the cleaning unit retracts from the ink jet heads 5 in a plan view when viewed in the Z direction. Various configurations such as a belt, a chain, a trapezoidal screw, and a ball screw can be employed as the driving mechanism. In the following description, the side in the Y direction close to the printing area S is defined as an inside in the Y direction and the side in the Y direction close to the cleaning area C is defined as an outside in the Y direction. The side in the X direction close to the opposing position is defined as one side and the side in the X direction close to the retracting position is defined as the other side.

Figure 5:
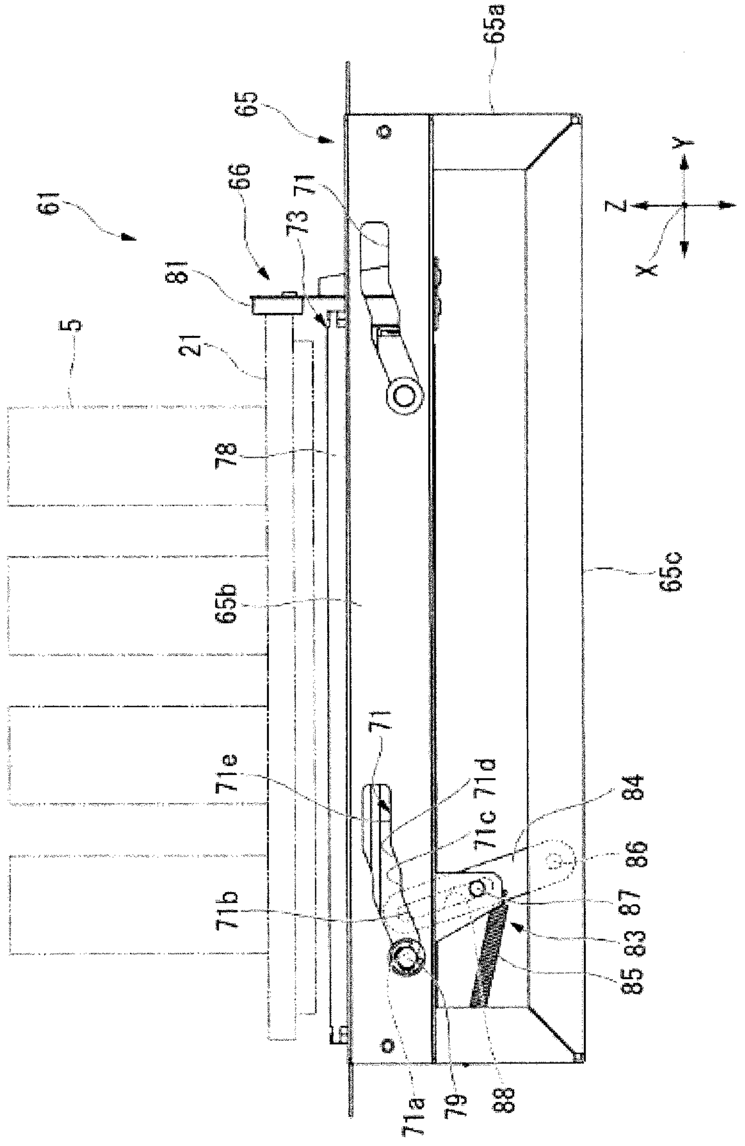
FIG. 5 is a side view of a cleaning unit according to the first embodiment when viewed from one side in an X direction.

FIG. 5 is a side view of the cleaning unit 61 when viewed from one side in the X direction.

As illustrated in FIG. 5, in the unit frame 65, a unit guide 71 is disposed in second side wall portions 65*b* facing each other in the X direction. The unit guide 71 is a cam groove penetrating the corresponding second side wall portion 65*b* in the X direction. Two unit guides 71 are formed in each second side wall portion 65*b* with a gap in the Y direction. The unit guides 71 have the same shape. Accordingly, in the following description, one unit guide 71 will be described as an example and description of the other unit guide 71 will not be repeated.

The unit guide 71 is formed in a step shape extending upward to the outside in the Y direction. Specifically, the unit guide 71 includes a lower step portion 71*a*, a first connecting portion 71*b*, a middle step portion 71*c*, a second connecting portion 71*d*, and an upper step portion 71*e* which are connected in the Y direction.

The lower step portion 71*a*, the middle step portion 71*c*, and the upper step portion 71*e* extend linearly in the Y direction.

The first connecting portion 71*b* extends upward to the outside in the Y direction. The first connecting portion 71*b* connects the lower step portion 71*a* and the middle step portion 71*c*.

The second connecting portion 71*d* extends upward to the outside in the Y direction. The second connecting portion 71*d* connects the middle step portion 71*c* and the upper step portion 71*e*.

As illustrated in FIG. 4, the cap unit 66 is disposed inside the unit frame 65. The cap unit 66 includes a carriage capping mechanism 73 and a head capping mechanism 75.

The carriage capping mechanism 73 serves to keep the ejection surface of the ink jet head 5 wet. The carriage capping mechanism 73 includes a cap frame 77 and a carriage cap 78 disposed on the cap frame 77.

As illustrated in FIG. 5, a support pin 79 extending in the X direction penetrates the cap frame 77. Both ends in the X direction of the support pin 79 are inserted into the unit guides 71 facing each other in the X direction among the unit guides 71. Accordingly, the cap unit 66 is configured to be movable in the Z direction with sliding movement in the Y direction. Specifically, the cap unit 66 slides among an opening position at which the support pin 79 is located in the lower step portion 71*a*, a carriage capping position at which the support pin 79 is located in the middle step portion 71*c*, and a head capping position at which the support pin 79 is located in the upper step portion 71*e*.

A portion of the cap frame 77 located on the outside in the Y direction is provided with a stopper wall portion 81 that can engage with the carriage 21 with movement of the carriage 21. The stopper wall portion 81 protrudes upward from the portion of the cap frame 77 located on the outside in the Y direction. The stopper wall portion 81 overlaps the carriage 21 when viewed in the Y direction when the cleaning unit 61 is located at the opposing position and the cap unit 66 is located at the opening position (hereinafter referred to as a cap initial position). The carriage 21 comes in contact with (engages with) the stopper wall portion 81 with the movement of the carriage 21 to the outside in the Y direction at the cap initial position. Accordingly, the cap frame 77 moves to the outside in the Y direction along with the carriage 21 with the movement of the carriage 21 to the outside in the Y direction. On the other hand, the stopper wall portion 81 is separated from the carriage 21 with the movement of the carriage 21 to the inside in the Y direction. Accordingly, the stopper wall portion 81 is disengaged from the carriage 21.

A link mechanism 83 that causes the cap unit 66 to move to the inside in the Y direction is disposed between the cap frame 77 and the unit frame 65. The link mechanism 83 includes a link bar 84 and a biasing member 85.

The link bar 84 is a plate-shaped member extending in the Z direction. The link bar 84 is suspended between a first rotation shaft 86 connected to the unit frame 65 and a second rotation shaft 87 connected to the unit frame 65. Specifically, the first rotation shaft 86 extending in the X direction is inserted into the bottom end portion of the link bar 84. The bottom end portion of the link bar 84 is configured to be rotatable about the first rotation shaft 86 relative to a unit bottom wall portion 65*c* of the unit frame 65.

A guide hole 88 penetrating the link bar 84 in the Y direction is formed in the top end portion of the link bar 84. The guide hole 88 is a long hole extending in the extending direction of the link bar 84. The second rotation shaft 87 extending in the X direction is inserted into the guide hole 88. That is, the link bar 84 is configured to be rotatable about the second rotation shaft 87 with respect to the cap unit 66 and to be relatively movable in the Z direction with respect to the cap unit 66.

The biasing member 85 is interposed between the link bar 84 and the unit frame 65. The biasing member 85 is, for example, a torsion coil spring. The biasing member 85 biases the cap unit 66 to the inside in the Y direction (the opening position).

As illustrated in FIG. 4, the carriage cap 78 is attached onto the unit frame 65. The carriage cap 78 is formed in a box shape which is opened upward.

Figure 6:
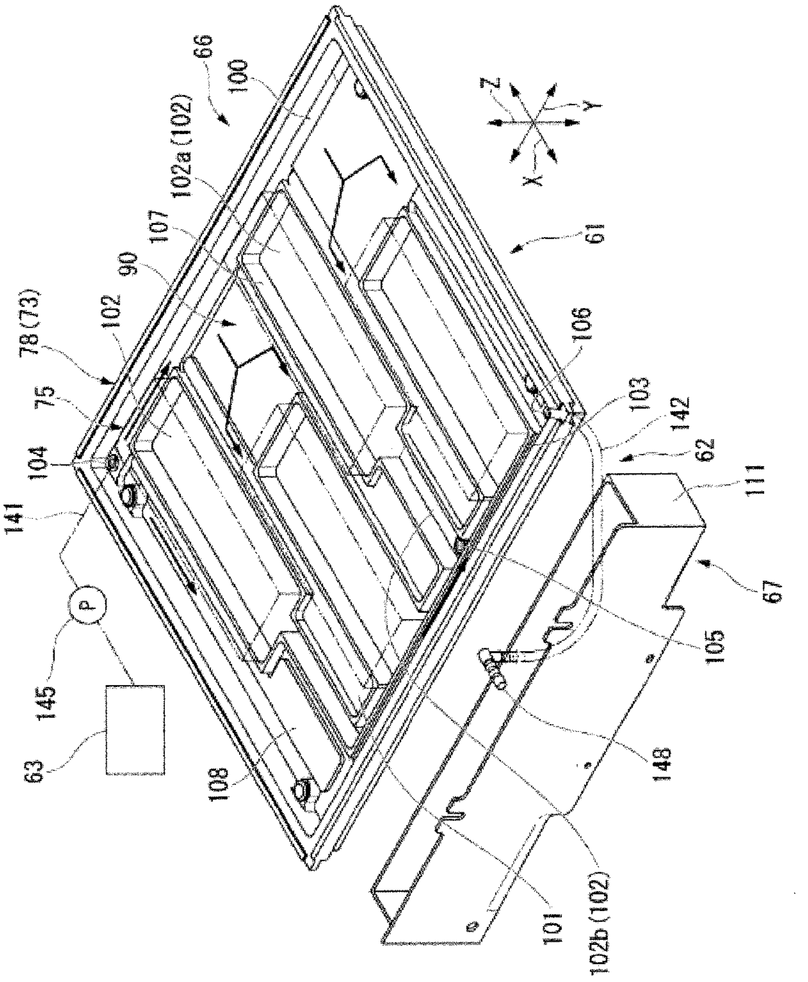
FIG. 6 is a perspective view of a carriage cap according to the first embodiment.

FIG. 6 is a perspective view of the carriage cap 78.

As illustrated in FIG. 6, a cleaning solution channel 90 in which a cleansing solution flows is formed on the bottom wall portion of the carriage cap 78. The cleaning solution channel 90 roughly includes a cleaning solution inlet channel 100, a distribution channel 101, a waste solution channel 102, and a cleaning solution outlet channel 103.

The cleaning solution inlet channel 100 extends in the Y direction on the other side in the X direction in the carriage cap 78. The cleaning solution inlet channel 100 is inclined downward from the inside in the Y direction to the outside. An inlet port 104 for supplying a cleaning solution into the cleaning solution inlet channel 100 is disposed at the inside end in the Y direction of the cleaning solution inlet channel 100.

A plurality of distribution channels 101 are arranged at intervals in the Y direction. Each distribution channel 101 extends in the X direction. The other end portion in the X direction of each distribution channel 101 is connected to the cleaning solution inlet channel 100. Each distribution channel 101 may be inclined downward from the other side in the X direction to one side.

The waste solution channel 102 includes a cap receiving portion 102*a* and a merging channel 102*b*.

The cap receiving portion 102*a* is formed between the distribution channels 101 adjacent to each other in the Y direction. The cap receiving portion 102*a* has a size which can receive the head capping mechanism 75 in a plan view when viewed in the Z direction. The cap receiving portion 102*a* may be inclined downward from the other side in the X direction to one side.

The merging channel 102*b* connects the cap receiving portions 102*a* on one side in the X direction with respect to each cap receiving portion 102*a*. A waste solution port 105 for discharging the cleaning solution flowing in the merging channel 102*b* is disposed in the merging channel 102*b*.

The cleaning solution outlet channel 103 extends in the Y direction on one side in the X direction in the carriage cap 78. The cleaning solution outlet channel 103 is connected to the distribution channels 101 (for example, the distribution channels 101 located at both ends in the Y direction) at least at both ends in the Y direction. The cleaning solution outlet channel 103 is inclined downward from the inside in the Y direction to the outside. An outlet port 106 for discharging a cleaning solution from the cleaning solution outlet channel 103 is disposed at the outside end in the Y direction of the cleaning solution outlet channel 103. The outlet port 106 protrudes upward from the bottom wall portion of the cleaning solution outlet channel 103. In this case, an outlet of the outlet port 106 (an outlet from the cleaning solution outlet channel 103) is located above the bottom wall portion of the cleaning solution outlet channel 103. The outlet of the outlet port 106 may be opened on a circumferential wall portion of the carriage cap 78.

In the example illustrated in FIG. 6, the waste solution channel 102 and the cleaning solution inlet channel 100 are partitioned, the waste solution channel 102 and the distribution channel 101 are partitioned, and the waste solution channel 102 and the cleaning solution outlet channel 103 are partitioned by partition walls 107. In the cleaning solution channel 90, an absorber 108 that can absorb the cleaning solution may be disposed in at least the distribution channels 101. In this case, the cleaning solution can be held by the absorber 108. Accordingly, even when the carriage cap 78 is inclined and the cleaning solution is biased in the cleaning solution channel 90 or supply of the cleaning solution is stopped, it is possible to prevent the cleaning solution from running out in at least the distribution channels 101. Here, the absorber may be disposed in the whole cleaning solution channel 90.

As illustrated in FIG. 4, a portion of the cleaning solution channel 90 other than the cap receiving portion 102*a* is covered with a carriage inner plate 89 from the upside.

Figure 7:
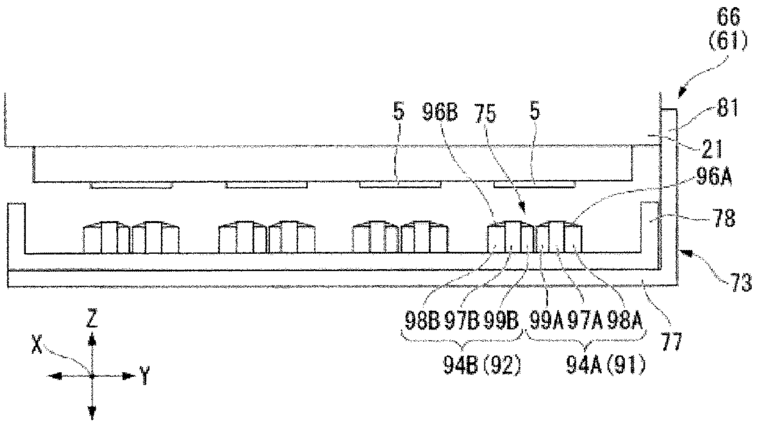
FIG. 7 is a schematic configuration diagram illustrating a state in which a cap unit is located at an opening position when an ink jet head, a carriage, and a cap unit are viewed from the X direction.

FIG. 7 is a schematic configuration diagram illustrating a state in which the cap unit 66 is located at the opening position when the ink jet head 5, the carriage 21, and the cap unit 66 are viewed from the X direction.

The top edge of the circumferential wall portion of the carriage cap 78 is located below the bottom surface of the carriage 21 and the ejection surface of the ink jet head 5 at the opening position. Accordingly, interference of the carriage cap 78 with the carriage 21 and the ink jet head 5 is prevented.

Figure 8:
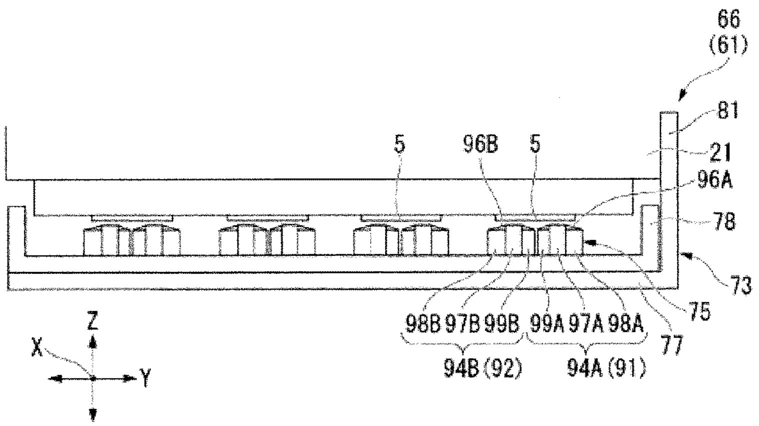
FIG. 8 is a schematic configuration diagram illustrating a state in which the cap unit is located at a carriage capping position when the ink jet head, the carriage, and the cap unit are viewed from the X direction.

FIG. 8 is a schematic configuration diagram illustrating a state in which the cap unit 66 is located at the carriage capping position when the ink jet head 5, the carriage 21, and the cap unit 66 are viewed from the X direction.

As illustrated in FIG. 8, at the carriage capping position, the carriage cap 78 covers the carriage 21 from the downside and surrounds the carriage 21. Accordingly, the nozzle holes 31 and 32 of all the ink jet heads 5 are covered.

Figure 9:
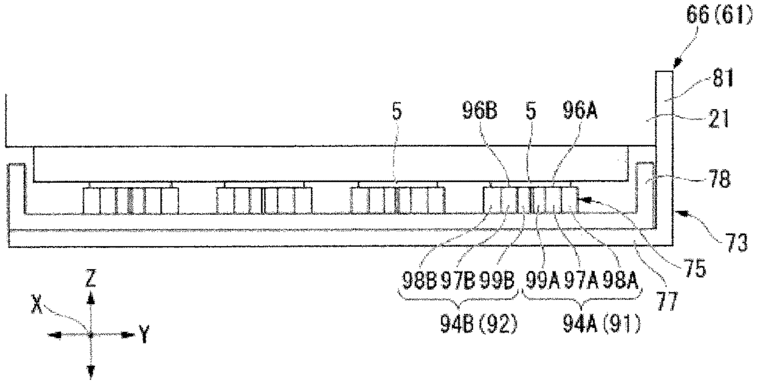
FIG. 9 is a schematic configuration diagram illustrating a state in which the cap unit is located at a head capping position when the ink jet head, the carriage, and the cap unit are viewed from the X direction.

FIG. 9 is a schematic configuration diagram illustrating a state in which the cap unit 66 is located at the head capping position when the ink jet head 5, the carriage 21, and the cap unit 66 are viewed from the X direction.

As illustrated in FIG. 9, the carriage cap 78 is located higher at the head capping position than at the carriage capping position.

As illustrated in FIG. 4, the head capping mechanism 75 is used to clean the ejection surface of the ink jet head 5 or the like. The head capping mechanisms 75 are separately disposed at the positions of the bottom wall portion of the carriage cap 78 facing the ink jet head 5 in the Z direction at the cap initial position. As illustrated in FIG. 9, the head capping mechanisms 75 come in contact with the ejection surfaces of the ink jet heads 5 from the downside at the head capping position. The head capping mechanisms 75 have the same configuration and thus one head capping mechanism 75 will be described in the following description.

Figure 10:
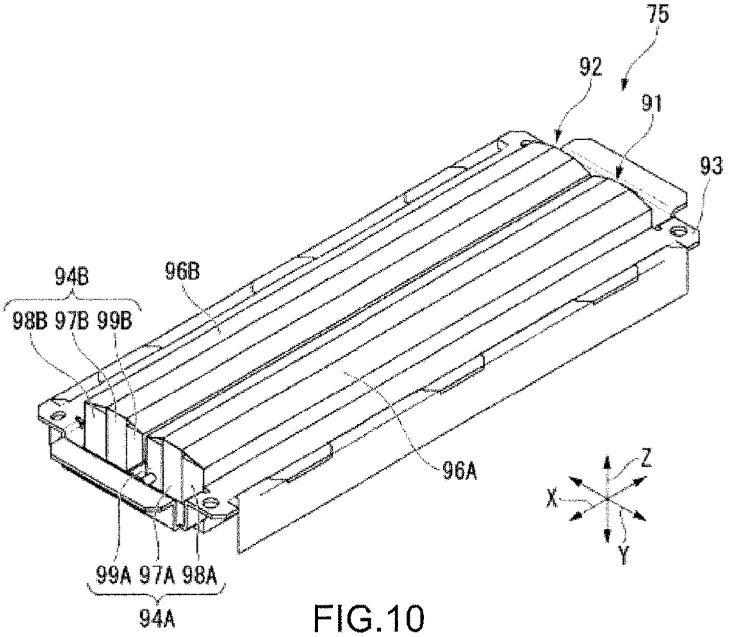
FIG. 10 is a perspective view of a head capping mechanism according to the first embodiment.

FIG. 10 is a perspective view of the head capping mechanism 75.

As illustrated in FIG. 10, the head capping mechanism 75 includes a first contact unit 91, a second contact unit 92, and a holder 93.

The holder 93 is fixed to a portion of the partition wall 107 partitioning the cap receiving portion 102*a*. The holder 93 holds the contact units 91 and 92 in a state in which the contact units are separated upward from the bottom wall portion of the waste solution channel 102.

The first contact unit 91 includes a pressing member 94A and a head sheet 96A.

The pressing member 94A has a configuration in which a plurality of pressing blocks 97A, 98A, and 99A are arranged in the Y direction. The pressing blocks 97A to 99A include a central pressing block 97A, and a first outer pressing block 98A and a second outer pressing block 99A that are disposed on both sides in the Y direction of the central pressing block 97A.

The central pressing block 97A is a porous member having absorbency (a sponge shape) formed of foamed resin. The central pressing block 97A is formed in a rectangular parallelepiped shape of which the long direction is parallel to the X direction. The width in the Y direction of the central pressing block 97A is smaller than the width in the Y direction of the first exposure hole 58 (see FIG. 3). As illustrated in FIGS. 3 and 9, the top surface of the central pressing block 97A faces the first nozzle array 56 on the ejection surface of the ink jet head 5 in the Z direction when the head capping mechanism 75 is located at the head capping position.

As illustrated in FIG. 10, the first outer pressing block 98A and the second outer pressing block 99A are porous members having absorbency (a sponge shape) formed of foamed resin. The heights in the Z direction of the first outer pressing block 98A and the second outer pressing block 99A are set to be less than that of the central pressing block 97A. Accordingly, the top surfaces of the first outer pressing block 98A and the second outer pressing block 99A are located below the top surface of the central pressing block 97A. As illustrated in FIGS. 3 and 9, the first outer pressing block 98A and the second outer pressing block 99A face the portions of the ejection surface (the nozzle guard 37), which are located on both sides in the Y direction of the first nozzle array 56 at the head capping position, in the Z direction. In the example illustrated in FIG. 10, the widths in the Y direction of the pressing blocks 97A to 99A decrease in the order of the first outer pressing block 98A, the central pressing block 97A, and the second outer pressing block 99A.

In this embodiment, the central pressing block 97A is formed of a harder material in shore A hardness than that of the first outer pressing block 98A and the second outer pressing block 99A. Specifically, the first outer pressing block 98A is formed of connected-bubble (with a configuration in which a plurality of bubbles communicate with each other) foamed resin. On the other hand, the central pressing block 97A and the second outer pressing block 99A are formed of independent-bubble (with a configuration in which a plurality of bubbles are independent from each other) foamed resin. Here, as long as at least the first outer pressing block 98A of the pressing blocks 97A to 99A is formed of connected-bubble foamed resin, the central pressing block 97A and the second outer pressing block 99A may be formed of connected-bubble foamed resin.

The pressing member 94A may not have absorbency as long as it is formed of at least an elastically deformable material. The pressing member 94A may not be divided into the plurality of pressing blocks 97A to 99A as long as the ejection surface is formed in an uneven shape along the concave surface from which the nozzle plate 35 is exposed and the convex surface from which the nozzle guard 37 is exposed.

The head sheet 96A is a sheet having absorbency formed of unwoven fabric or woven fabric. The head sheet 96A covers the top side of the pressing member 94A (the pressing blocks 97A to 99A) and both sides in the Y direction together. A portion of the head sheet 96A which is located above the pressing member 94A comes in contact with the ejection surface of the ink jet head 5 from the downside when the head capping mechanism 75 is located at the head capping position.

As illustrated in FIGS. 6 and 10, a first end (the outside end in the Y direction) of the head sheet 96A is immersed in the cleaning solution in the distribution channel 101. On the other hand, a second end (the inside end in the Y direction) of the head sheet 96A is separated from the waste solution channel 102. It is preferable that the area density (weight (g) per unit area ($m^2$)) of the head sheet 96A be equal to or greater than, for example, 70 $g/m^2$. Accordingly, the open porosity (the area of openings per unit area) of the head sheet 96A is less than the open porosity of the top end surfaces of the pressing blocks 97A to 99A.

As illustrated in FIG. 10, the second contact unit 92 is disposed on the inside in the Y direction of the first contact unit 91. In the following description, the same elements of the second contact unit 92 as in the first contact unit 91 may not be described by adding "B" to the same reference numerals as in the first contact unit 91.

Similarly to the first contact unit 91, the second contact unit 92 includes a pressing member 94B and a head sheet 96B.

As illustrated in FIGS. 3 and 9, the central pressing block 97B of the second contact unit 92 faces the second nozzle array 57 of the ejection surface of the ink jet head 5 in the Z direction when the head capping mechanism 75 is located at the head capping position.

The outer pressing blocks 98B and 99B face portions of the ejection surface (the nozzle guard 37) which are located on both sides in the Y direction of the second nozzle array 57.

The head sheet 96B covers the top side of the pressing member 94B (the pressing blocks 97B to 99B) and both sides in the Y direction together. A portion of the head sheet 96B which is located above the pressing member 94B comes in contact with the ejection surface of the ink jet head 5 from the downside when the head capping mechanism 75 is located at the head capping position. A first end (the inside end in the Y direction) of the head sheet 96B is immersed in the cleaning solution in the distribution channel 101. On the other hand, a second end (the outside end in the Y direction) of the head sheet 96B is separated from the waste solution channel 102. A partition for partitioning the first contact unit 91 and the second contact unit 92 from each other may be disposed between the first contact unit 91 and the second contact unit 92.

As illustrated in FIG. 4, the blade unit 67 is disposed on one side in the X direction of the unit frame 65. The blade unit 67 wipes the ejection surface of each ink jet head 5 in the course of movement of the cleaning unit 61 from the opposing position to the retracting position.

Figure 11:
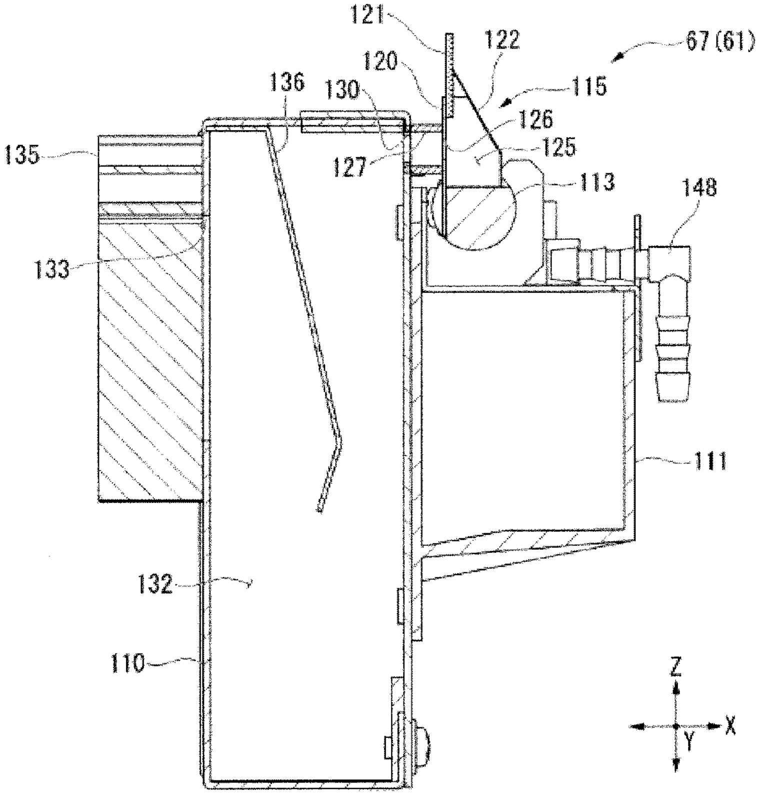
FIG. 11 is a cross-sectional view of a blade unit taken along line XI-XI in FIG. 4.

FIG. 11 is a cross-sectional view of the blade unit 67 taken along line XI-XI in FIG. 4.

The blade unit 67 includes a box-shaped blade frame 110. In the blade frame 110, a blade pool 111 is attached to the other side wall portion located on the other side in the X direction. The blade pool 111 is formed in a box shape which is opened upward. A cleaning solution supplied from the cleaning solution supply mechanism 62 is stored in the blade pool 111. The other side end in the X direction of the blade pool 111 is fixed to the second side wall portion 65*b* (see FIG. 4 or the like) which is located on one side in the X direction of the unit frame 65. Accordingly, the blade frame 110 is disposed with a gap in the X direction from the unit frame 65. A float sensor 116 (see FIG. 12) for detecting a liquid level of the cleaning solution is installed in the blade pool 111.

As illustrated in FIG. 4, a stay 112 extending to the other side in the X direction is attached to side wall portions facing each other in the Y direction of the blade frame 110. A support shaft 113 extending in the Y direction is suspended between the stays 112. The support shaft 113 is supported by the stays 112 to be rotatable about the Y direction. The support shaft 113 is provided with a blade mechanism 115. Four blade mechanisms 115 are arranged at intervals in the Y direction to correspond to the ink jet heads 5. In the following description, one blade mechanism 115 of the plurality of blade mechanisms 115 will be described.

As illustrated in FIG. 11, the blade mechanism 115 includes a blade holder 120, a first blade 121, and a second blade 122.

The blade holder 120 is attached to the support shaft 113 in a state in which the blade holder protrudes upward from the support shaft 113.

The first blade 121 is formed of a flexible material (such as rubber or resin). The first blade 121 is formed in a plate shape. The first blade 121 extends in the Z direction and is fixed to the blade holder 120. The tip (the top end) of the first blade 121 protrudes upward from the blade holder 120 and is disposed at a height which can come in sliding contact with the ejection surface of the ink jet head 5.

The second blade 122 is formed of a flexible material (such as rubber or resin). The second blade 122 is formed in a plate shape. The second blade 122 extends upward to one side in the X direction and is fixed to the blade holder 120. The tip of the second blade 122 may be disposed at a height which can come in sliding contact with the ejection surface of the ink jet head 5. In the example illustrated in FIG. 11, the tip of the second blade 122 is located lower than the tip of the first blade 121. The tip of the second blade 122 can come in contact with and be separated from the tip of the first blade 121 with bending deformation of the blades 121 and 122.

In the blade mechanism 115, a space surrounded with the blade holder 120 and the blades 121 and 122 constitutes a first suction chamber 125. The blades 121 and 122 may be formed of the same material or may be formed of different types of materials. In this embodiment, a case in which the first suction chamber 125 is formed by the blade holder 120 and the blades 121 and 122 is described, but the first suction chamber 125 may be defined using three or more blades.

The blade mechanism 115 is movable between the immersing position (the separating position) and the wiping position with rotation of the support shaft 113. At the immersing position, at least the tips of the blades 121 and 122 of the blade mechanism 115 are immersed in the cleaning solution in the blade pool 111 (see FIG. 14). On the other hand, at the wiping position, at least the tips of the first blade 121 of the blade mechanism 115 is disposed at a height which can come in sliding contact with the ejection surface of the ink jet head 5.

A first communication hole 126 that causes the inside and the outside of the first suction chamber 125 to communicate with each other is formed in the blade holder 120. The first communication hole 126 penetrates the blade holder 120 in the X direction. A connecting tube 127 is connected to the first communication hole 126. The connecting tube 127 protrudes to one side in the X direction from the blade holder 120. The first communication hole 126 may be a long hole of which the major axis is parallel to the Y direction or a plurality of through-holes may be arranged at intervals in the Y direction.

The inner space of the blade frame 110 constitutes a second suction chamber 132. The second suction chamber 132 can communicate with the first suction chamber 125 via a second communication hole 130 formed on the other side wall portion of the blade frame 110 and the connecting tube 127. The connecting tube 127 may be connected to the blade holder 120 (the first communication hole 126) or may be connected to the blade frame 110 (the second communication hole 130).

In the blade frame 110, a suction hole 133 that causes the inside and the outside of the blade frame 110 to communicate with each other is formed in one side wall portion located on one side in the X direction. A plurality of suction holes 133 are formed at intervals in the Y direction in the upper part of one side wall portion. A plurality of blowers 135 covering the suction holes 133 from one side in the X direction are attached to one side wall portion of the blade frame 110. The blowers 135 communicate with the second suction chamber 132 via the suction holes 133, respectively. A baffle plate 136 that partitions the suction hole 133 and the second communication hole 130 in the X direction is disposed in the top wall portion of the blade frame 110. In the second suction chamber 132, an absorber (not illustrated) having absorbency may be disposed in a portion located below the baffle plate 136.

Figure 12:
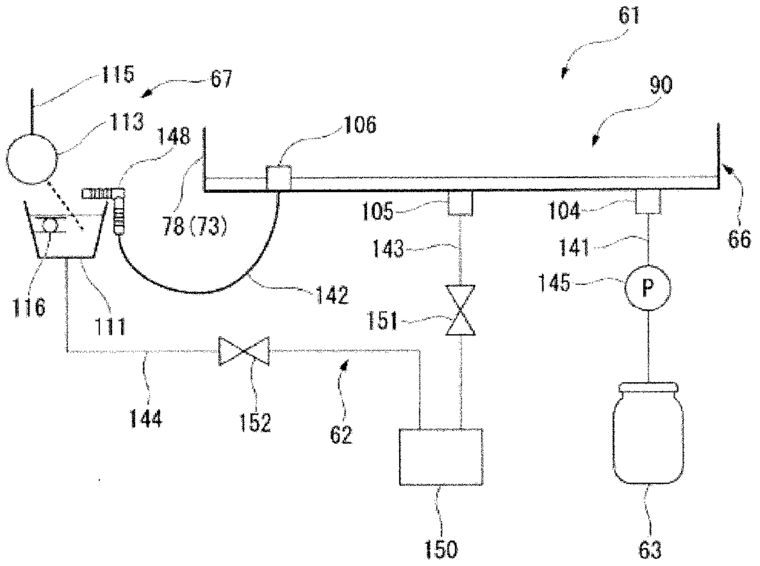
FIG. 12 is a schematic configuration diagram of a cleaning solution supply mechanism according to an embodiment.

FIG. 12 is a schematic configuration diagram of the cleaning solution supply mechanism 62.

As illustrated in FIG. 12, the cleaning solution supply mechanism 62 supplies a cleaning solution stored in the cleaning solution tank 63 to the cleaning solution channel 90 and the blade pool 111. Specifically, the cleaning solution supply mechanism 62 includes a supply pipe 141, a connecting pipe 142, a first waste solution pipe 143, a second waste solution pipe 144, and a cleaning solution pump 145 disposed on the supply pipe 141.

The supply pipe 141 connects the cleaning solution tank 63 to the cleaning solution inlet channel 100 of the cleaning solution channel 90 (see FIG. 6). Specifically, a first end of the supply pipe 141 is connected to the cleaning solution tank 63. A second end of the supply pipe 141 is connected to the inlet port 104.

The cleaning solution pump 145 pressurizes the inside of the supply pipe 141 and sends out the cleaning solution to the cleaning solution channel 90 via the supply pipe 141.

The connecting pipe 142 connects the cleaning solution outlet channel 103 of the cleaning solution channel 90 to the blade pool 111. Specifically, a first end of the connecting pipe 142 is connected to the outlet port 106 of the cleaning solution outlet channel 103. A second end of the connecting pipe 142 is connected to a pool port 148 disposed in the blade pool 111.

The first waste solution pipe 143 connects the waste solution channel 102 of the cleaning solution channel 90 to a waste solution tank 150. Specifically, a first end of the first waste solution pipe 143 is connected to a waste solution port 105 of the waste solution channel 102 illustrated in FIG. 6. A second end of the first waste solution pipe 143 is connected to the waste solution tank 150. A switching valve 151 is disposed on the first waste solution pipe 143. The switching valve 151 may not be provided.

The second waste solution pipe 144 connects the blade pool 111 to the waste solution tank 150. Specifically, a first end of the second waste solution pipe 144 is connected to a waste solution port, which is not illustrated, disposed in the blade pool 111. A second end of the second waste solution pipe 144 is connected to the waste solution tank 150. A switching valve 152 is disposed on the second waste solution pipe 144.

[Operating Method of Printer]

An operating method of the printer 1 will be described below. In the following description, a printing method, a wiping method, a carriage capping method, and a head capping method, and a cleaning solution supplying method will be sequentially described and then a printing standby method will be described.

<Printing Method>

First, a printing method on a printing medium P will be described.

As illustrated in FIG. 1, when the printer 1 is activated, the grit roller 11 of the conveyance mechanism 2 rotates and thus a printing medium P is conveyed in the X direction between the grit roller 11 and the pinch roller 12. At the same time, the driving motor 26 rotationally drives the pulley 24 to move the endless belt 25. Accordingly, the carriage 21 is guided by a guide rail which is not illustrated and reciprocates in the printing area S in the Y direction.

In the meantime, as illustrated in FIG. 3, a drive voltage is applied to the drive electrodes of the head tips 33 and 34 of each ink jet head 5. Then, a thickness slip transformation is caused in the driving walls 45 and pressure waves are generated in ink filled in the ejection channels 43. The internal pressure of the ejection channels 43 increase by the pressure waves and the ink is ejected via the nozzle holes 31 and 32. The ink is impacted on the printing medium P to print a variety of information on the printing medium P.

<Wiping Method>

A wiping method of the ejection surface by the blade unit 67 will be described below. The following description is started at a time point at which the cap unit 66 is located at the cap initial position and the blade unit 67 is located at the wiping position. At the cap initial position, the cap unit 66 is held at the opening position.

First, the endless belt 25 illustrated in FIG. 1 circulates to move the carriage 21 to the cleaning area C. At this time, as illustrated in FIG. 7, the carriage 21 is moved from the inside in the Y direction to the position at which the carriage comes in contact with the stopper wall portion 81 (a wiping standby position). Accordingly, as illustrated in FIG. 4, the ink jet heads 5 are located at the same positions in the Y direction as the corresponding blade mechanisms 115 and face the corresponding head capping mechanisms 75 in the Z direction.

Figure 13:
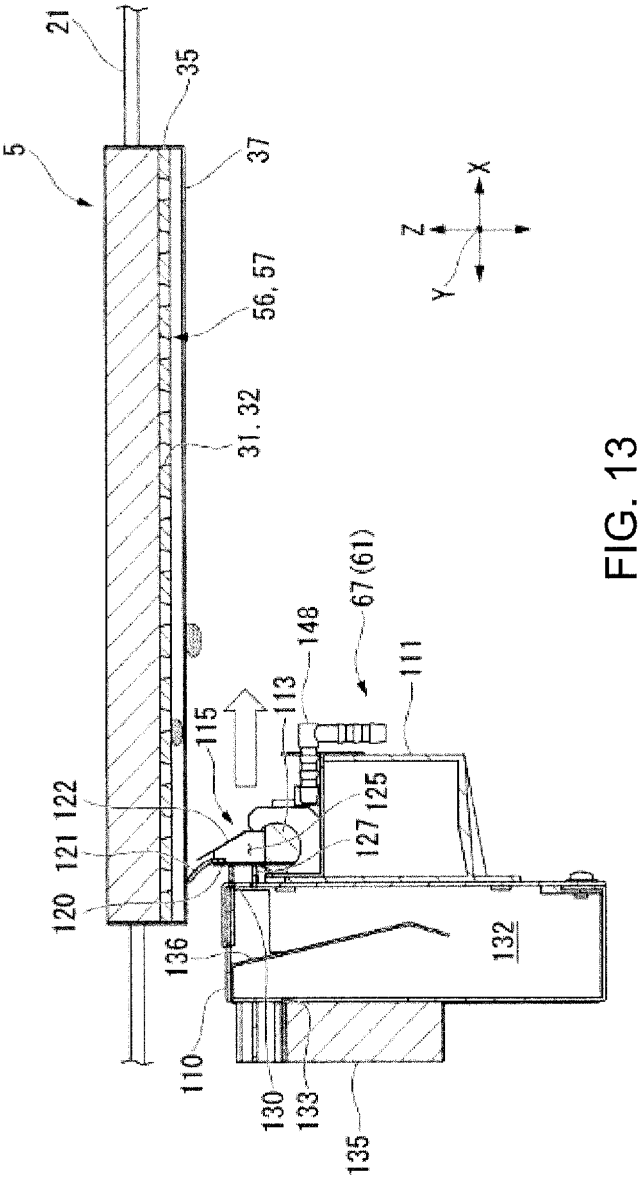
FIG. 13 is an operation diagram illustrating a wiping method.

FIG. 13 is an operation diagram illustrating the wiping method.

Subsequently, the blower 135 is driven as illustrated in FIG. 13. Then, air in the second suction chamber 132 is suctioned via the suction hole 133, and air in the first suction chamber 125 is suctioned via the second communication hole 130, the connecting tube 127, and the first communication hole 126. Accordingly, the insides of the first suction chamber 125 and the second suction chamber 132 are kept at a negative pressure.

Thereafter, the cleaning unit 61 is moved to the retracting position. Then, when the blade mechanism 115 passes through the ink jet head 5, at least the first blade 121 comes in sliding contact with the ejection surface of the ink jet head 5. Accordingly, the ejection surface of the ink jet head 5 is wiped.

In the course of sliding contact of the blade mechanism 115 with the ejection surface of the ink jet head 5, the blades 121 and 122 are deformed in a bending manner and thus the tips of the blades 121 and 122 are separated from each other. Accordingly, the inside and the outside of the first suction chamber 125 communicate with each other via the gap between the tips of the blades 121 and 122. At this time, since the inside of the first suction chamber 125 is kept at the negative pressure, ink attached to the blades 121 and 122 or the ejection surface is suctioned into the first suction chamber 125 via the gap between the tips of the blades 121 and 122. The ink suctioned into the first suction chamber 125 flows into the second suction chamber 132 via the connecting tube 127. Accordingly, it is possible to clean the ejection surface and to remove the ink attached to the ejection surface.

In this embodiment, a degree of pressing of the first blade 121 to the ejection surface at the time of wiping (a degree of movement of the first blade 121 to the ejection surface in the normal direction of the ejection surface after the tip of the first blade 121 comes in contact with the ejection surface) in the Z direction preferably ranges from 0.5 mm to 3.0 mm.

By setting the degree of pressing to 0.5 mm or more, an appropriate pressing force can be applied to the ejection surface from the first blade 121 and it is thus possible to effectively wipe the ejection surface. On the other hand, by setting the degree of pressing to 3.0 mm or less, it is possible to prevent the pressing force acting on the ejection surface from increasing excessively and to achieve extension of a lifespan of the ink jet head 5 or the blade mechanism 115.

Figure 14:
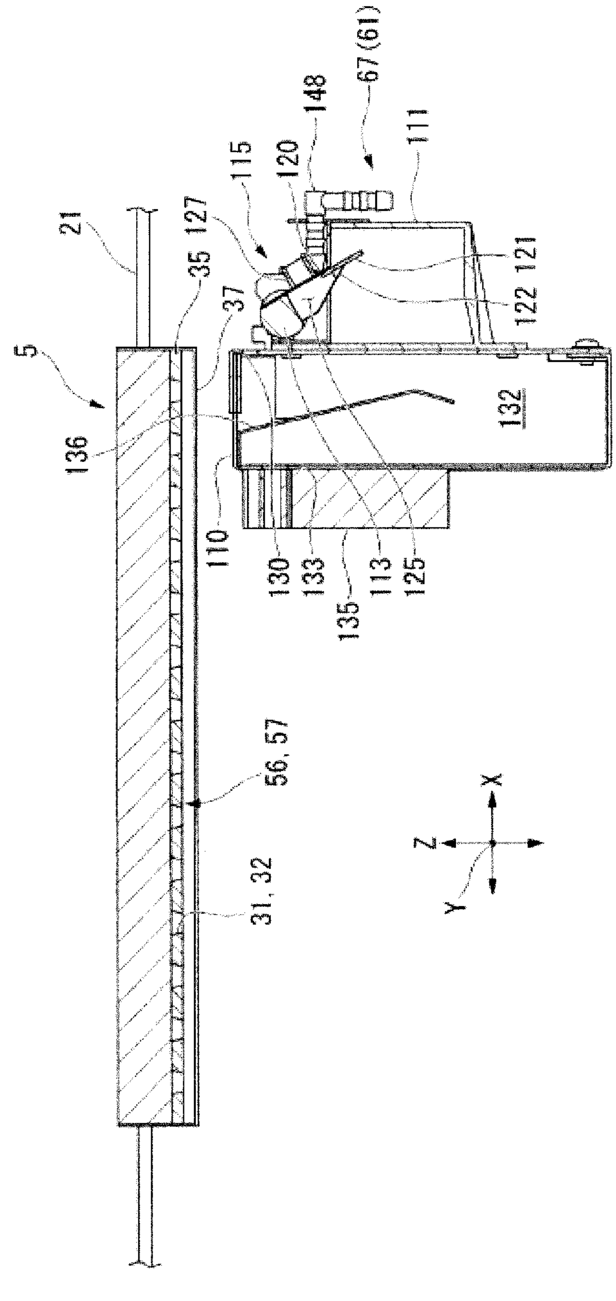
FIG. 14 is an operation diagram illustrating the wiping method.
Figure 15:
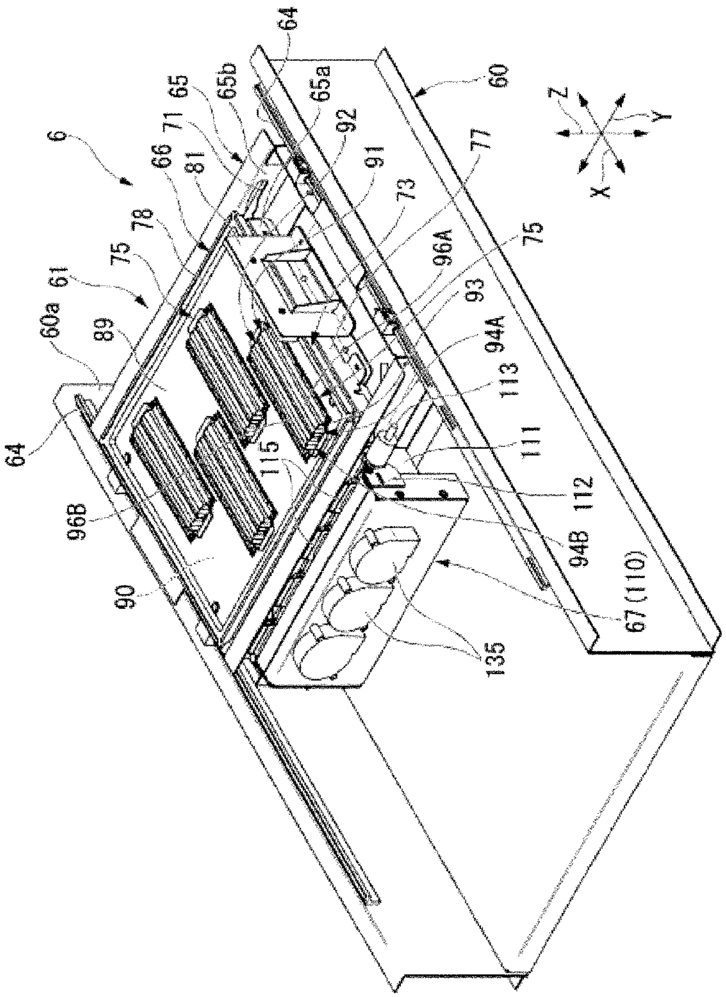
FIG. 15 is an operation diagram illustrating the wiping method.

FIGS. 14 and 15 are operation diagrams illustrating the wiping method.

As illustrated in FIGS. 14 and 15, driving of the blower 135 is stopped at a time point at which the cleaning unit 61 reaches the retracting position. Subsequently, the support shaft 113 rotates to move the blade mechanism 115 to the immersing position. Then, the tips of the blades 121 and 122 are immersed in the cleaning solution in the blade pool 111. Accordingly, it is possible to clean the blades 121 and 122 and to remove ink attached to the blades 121 and 122.

Thereafter, by returning the cleaning unit 61 to the opposing position, the wiping method by the blade unit 67 is completed. Before the cleaning unit 61 is returned to the opposing position, the carriage 21 may be returned to the printing area S.

<Carriage Capping Method>

A carriage capping method by the carriage capping mechanism 73 will be described below. The following description is started at a time point at which the carriage 21 is located at the wiping standby position of the cleaning area C and the cap unit 66 is located at the cap initial position (the cap unit 66 is located at the opening position).

First, the carriage 21 moves from the wiping standby position to the outside in the Y direction as illustrated in FIG. 7. Then, the cap unit 66 is pressed against the carriage 21 toward the outside in the Y direction (the direction against the biasing force of the biasing member 85) via the stopper wall portion 81. Accordingly, with the movement of the carriage 21 to the outside in the Y direction, the cap unit 66 moves to the outside in the Y direction along with the carriage 21.

Figure 16:
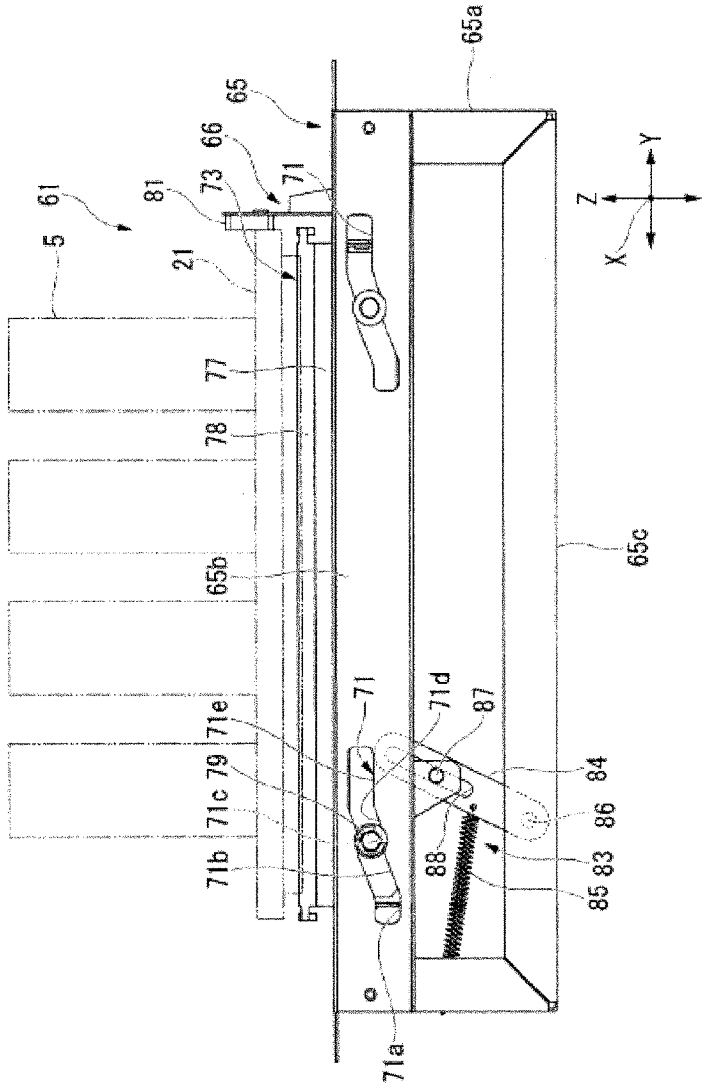
FIG. 16 is an operation diagram illustrating a carriage capping method.

FIG. 16 is an operation diagram illustrating the carriage capping method.

As illustrated in FIG. 16, in the course of movement of the cap unit 66 from the opening position to the outside in the Y direction, the support pin 79 moves to the outside in the Y direction in the unit guide 71. Specifically, the support pin 79 reaches the middle step portion 71*c* from the lower step portion 71*a* via the first connecting portion 71*b* in the unit guide 71. The support pin 79 moves upward toward the outside in the Y direction in the course of movement in the first connecting portion 71*b*. Accordingly, the cap unit 66 moves upward toward the outside in the Y direction. At the time point at which the support pin 79 reaches the middle step portion 71*c*, the cap unit 66 reaches the carriage capping position. As illustrated in FIG. 8, at the carriage capping position, the carriage cap 78 covers the carriage 21 from the downside and covers the nozzle holes 31 and 32 of all the ink jet heads 5. Accordingly, ink in the nozzle holes 31 and 32 is prevented from being dried and a wet state of the ink is maintained. At the carriage capping position, the head sheets 96A and 96B do not come in contact with the ejection surface.

In order to cause the cap unit 66 to move from the carriage capping position to the opening position, the carriage 21 moves to the inside in the Y direction (the wiping standby position). Then, the cap unit 66 moves downward to the inside in the Y direction by moving to the inside in the Y direction along with the carriage 21 by the biasing force of the biasing member 85. Accordingly, as illustrated in FIG. 7, the cap unit 66 moves to the opening position.

<Head Capping Method>

A head capping method by the head capping mechanism 75 will be described below. The following description is started at a time point at which the cap unit 66 (the carriage 21) is located at the carriage capping position.

First, the carriage 21 moves to the outside in the Y direction as illustrated in FIG. 8. Then, the cap unit 66 is pressed against the carriage 21 to the outside in the Y direction (the direction against the biasing force of the biasing member 85) via the stopper wall portion 81. Accordingly, with the movement of the carriage 21 to the outside in the Y direction, the cap unit 66 moves to the outside in the Y direction along with the carriage 21.

Figure 17:
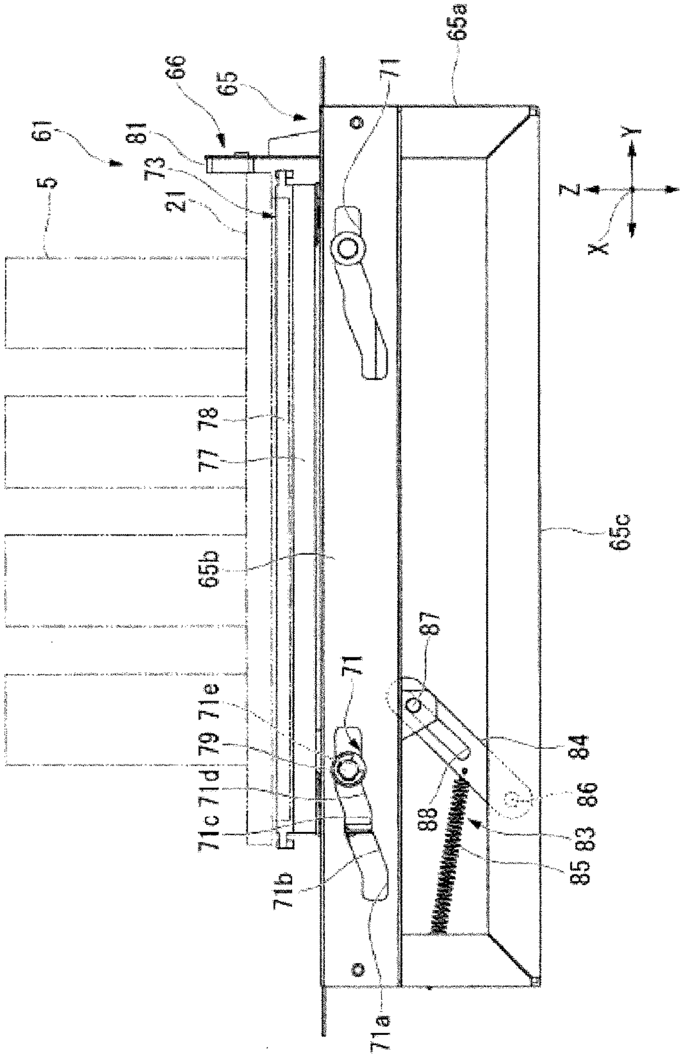
FIG. 17 is an operation diagram illustrating a head capping method.

FIG. 17 is an operation diagram illustrating the head capping method.

As illustrated in FIG. 17, in the course of movement of the cap unit 66 from the carriage capping position to the outside in the Y direction, the support pin 79 moves to the outside in the Y direction in the unit guide 71. Specifically, the support pin 79 reaches the upper step portion 71*e* from the middle step portion 71*c* via the second connecting portion 71*d* in the unit guide 71. The support pin 79 moves upward toward the outside in the Y direction in the course of movement in the second connecting portion 71*d*. Accordingly, the cap unit 66 moves upward toward the outside in the Y direction. At the time point at which the support pin 79 reaches the upper step portion 71*e*, the cap unit 66 reaches the carriage capping position.

As illustrated in FIG. 9, at the head capping position, the head capping mechanism 75 comes in contact with the ejection surface of the ink jet head 5 from the downside. Specifically, in each head capping mechanism 75, the pressing member 94A of the first contact unit 91 comes in contact with the ejection surface of the ink jet head 5 with the head sheet 96A interposed therebetween. At this time, the central pressing block 97A comes in contact with the first nozzle array 56 (the nozzle plate 35) via the first exposure hole 58. On the other hand, the outer pressing blocks 98A and 99A come in contact with the bottom surface of the nozzle guard 37.

In each head capping mechanism 75, the pressing member 94B of the second contact unit 92 comes in contact with the ejection surface of the ink jet head 5 with the head sheet 96B interposed therebetween. At this time, the central pressing block 97B comes in contact with the second nozzle array 57 (the nozzle plate 35) via the second exposure hole 59. On the other hand, the outer pressing blocks 98B and 99B come in contact with the bottom surface of the nozzle guard 37.

At the head capping position, ink attached to the ejection surface is dissolved by cleaning solution with which the head sheets 96A and 96B are impregnated and is absorbed by the head sheet 96A and 96B. Accordingly, it is possible to clean the ejection surface. The contact units 91 and 92 may seal (close) the nozzle holes 31 and 32 at the head capping position.

As illustrated in FIGS. 6 and 10, the first ends of the head sheets 96A and 96B are immersed in the cleaning solution in the distribution channels 101. Accordingly, the head sheets 96A and 96B are impregnated with the cleaning solution in the distribution channels 101 from the first ends by a capillary phenomenon or the like. The cleaning solution with which the head sheets 96A and 96B diffuses from the first ends to the second ends. A part of the cleaning solution reaching the second ends of the head sheets 96A and 96B flows in the cap receiving portion 102*a* of the waste solution channel 102. As illustrated in FIG. 6, the cleaning solution flowing in the cap receiving portion 102*a* flows to one side in the X direction in the cap receiving portion 102*a* and then flows into the waste solution port 105 via the merging channel 102*b*. The cleaning solution flowing into the waste solution port 105 is discharged to the waste solution tank 150 via the first waste solution pipe 143 illustrated in FIG. 12.

As illustrated in FIGS. 7 and 8, in order to cause the cap unit 66 to move from the head capping position to the opening position, the carriage 21 moves to the inside in the Y direction (the wiping standby position). Then, the cap unit 66 moves downward to the inside in the Y direction by moving to the inside in the Y direction along with the carriage 21 by the biasing force of the biasing member 85. Accordingly, the cap unit 66 moves to the opening position.

<Cleansing Solution Supplying Method>

A cleaning solution supplying method to the cleaning solution channel 90 or the blade pool 111 will be described below.

First, as illustrated in FIG. 12, the cleaning solution stored in the cleaning solution tank 63 flows in the supply pipe 141 by driving the cleaning solution pump 145. The cleaning solution flowing in the supply pipe 141 is supplied to the cleaning solution inlet channel 100 via the inlet port 104 as illustrated in FIG. 6. The cleaning solution supplied to the cleaning solution inlet channel 100 is distributed to the distribution channels 101 in the course of flowing to the outside in the Y direction in the cleaning solution inlet channel 100. A part of the cleaning solution flowing in the distribution channels 101 diffuses to the head sheets 96A and 96B as described above and is provided for cleaning the ejection surface.

On the other hand, the cleaning solution passing through the distribution channels 101 flows into the cleaning solution outlet channel 103. The cleaning solution flowing into the cleaning solution outlet channel 103 flows in the cleaning solution outlet channel 103 to the inside in the Y direction. When the liquid level of the cleaning solution flowing in the cleaning solution outlet channel 103 is higher than the outlet of the outlet port 106, the cleaning solution flows into the outlet port 106. The cleaning solution flowing into the outlet port 106 flows in the connecting pipe 142 to the blade pool 111 due to a level difference between the liquid level of the cleaning solution in the cleaning solution outlet channel 103 and the liquid level of the cleaning solution in the blade pool 111. Then, the cleaning solution flowing in the connecting pipe 142 is supplied to the blade pool 111 via the pool port 148. The cleaning solution supplied to the blade pool 111 is provided for cleaning the blades 121 and 122 as described above.

As illustrated in FIG. 12, the operation of the cleaning solution pump 145 can be controlled on the basis of the detection result (the liquid level in the blade pool 111) from the float sensor 116 installed in the blade pool 111. Specifically, it is first determined whether the liquid level in the blade pool 111 is equal to or higher than a predetermined value. Then, when the liquid level in the blade pool 111 is lower than the predetermined value (for example, a liquid level at which the blades 121 and 122 are not immersed), the cleaning solution pump 145 is driven. On the other hand, when the liquid level of the blade pool 111 is equal to or higher than the predetermined value, the driving of the cleaning solution pump 145 is stopped. Accordingly, the cleaning solution can be appropriately supplied to the cleaning solution channel 90 and the blade pool 111.

As illustrated in FIG. 12, by appropriately opening the switching valve 151 disposed in the first waste solution pipe 143, the cleaning solution in the waste solution channel 102 is discharged to the waste solution tank 150. By appropriately opening the switching valve 152 disposed in the second waste solution pipe 144, the cleaning solution supplied to the blade pool 111 is discharged to the waste solution tank 150.

<Printing Standby Method>

Figure 18:
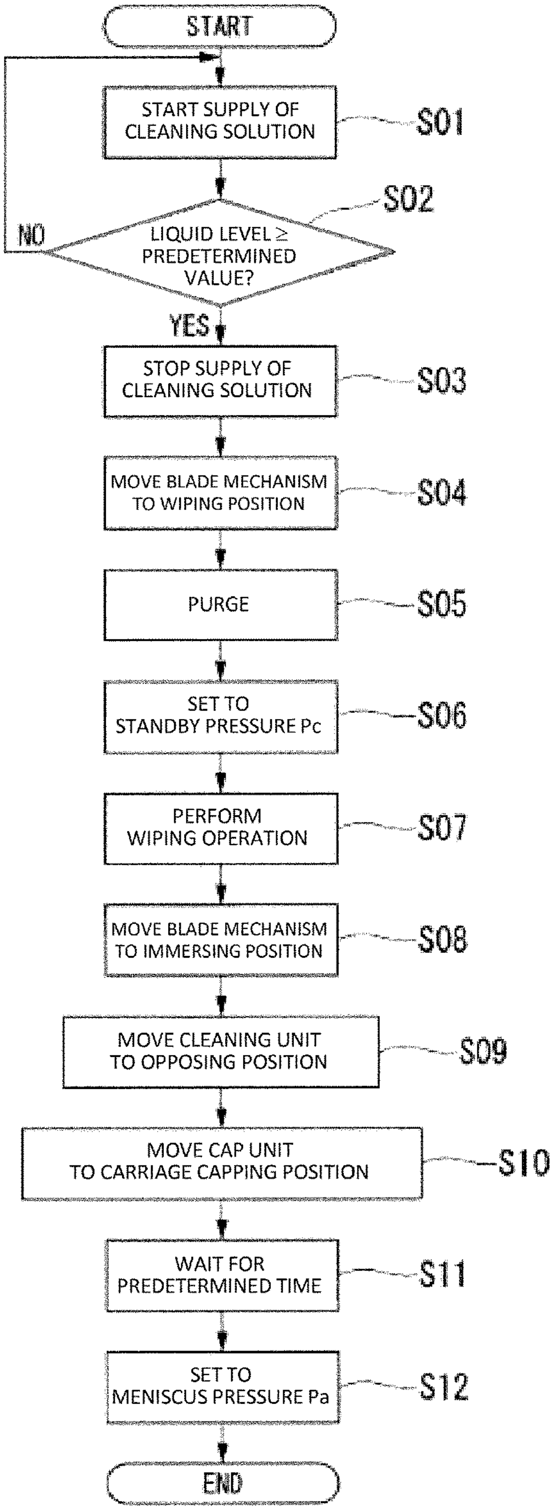
FIG. 18 is a flowchart illustrating a printing standby method.

A standby operation when an ejection operation of the ink jet head 5 is started will be described below. FIG. 18 is a flowchart illustrating a printing standby method. The following description is started at the time point at which the cap unit 66 is located in the capping initial position, the blade unit 67 is located at the wiping standby position, and the blade mechanism 115 is located at the immersing position. It is assumed that ink in the nozzle holes 31 and 32 forms an appropriate (concave curved) meniscuses by surface tension acting on the inner surfaces of the nozzle holes 31 and 32 or the like in a state in which the ink jet head 5 does not eject the ink. That is, in the ink jet head 5, by keeping the pressure in the ejection channels 43 at a desired negative pressure (for example, a meniscus pressure Pa), the meniscuses are maintained and ink is not ejected. On the other hand, by setting the pressure in the ejection channels 43 to a desired positive pressure, the meniscuses are destroyed and ink is ejected from the nozzle holes 31 and 32.

As illustrated in FIG. 18, in Step S01, a cleaning solution is supplied to the cleaning solution channel 90 and the blade pool 111 using the same method as the above-mentioned cleaning solution supplying method. Specifically, the cleaning solution in the cleaning solution tank 63 is supplied to the distribution channels 101 of the cleaning solution channel 90 and is then supplied to the blade pool 111 via the distribution channels 101.

In Step S02, it is determined whether the liquid level in the blade pool 111 is equal to or higher than a predetermined value on the basis of the detection result from the float sensor 116 installed in the blade pool 111.

When the determination result of Step S02 is "NO" (the liquid level is less than the predetermined value), it is determined that the cleaning solution is not satisfactorily supplied to the distribution channels 101 and the blade pool 111 yet. In this case, the cleaning solution is supplied again in Step S01.

When the determination result of Step S02 is "YES" (the liquid level is equal to or higher than the predetermined value), it is determined that the cleaning solution is satisfactorily supplied to the distribution channels 101 and the blade pool 111. In this case, Step S03 is performed.

In Step S03, the driving of the cleaning solution pump 145 is stopped.

Subsequently, in Step S04, the blade mechanism 115 moves from the immersing position to the wiping position.

In Step S05, purging of the ink jet head 5 is performed. The purging is an operation of recovering the ejection performance before printing. Specifically, by pressurizing the insides of the ejection channels 43, a pressure in the ejection channels 43 (for example, a purge pressure Pb) is maintained to such an extent that the meniscuses are destroyed and ink leaks from the nozzle holes 31 and 32. That is, the purge pressure Pb is set to be greater than the meniscus pressure Pa (Pb>Pa). Accordingly, dust or bubbles entering the nozzle holes 31 and 32, ink which has been dried to increase viscosity thereof, and the like are discharged from the nozzle holes 31 and 32. The ink discharged from the nozzle holes 31 and 32 is absorbed by the head sheets 96A and 96B or the pressing members 94A and 94B of the head capping mechanism 75 and is discharged to the cap receiving portion 102*a*.

After the purging is performed for a predetermined time, Step S06 is performed.

Then, in Step S06, the pressures in the ejection channels 43 are set to a standby pressure Pc. The standby pressure Pc is a pressure of such an extent that ink swells in a convex shape from the nozzle holes 31 and 32 and does not leak from the nozzle holes 31 and 32. That is, the standby pressure Pc is set to be greater than the meniscus pressure Pa and less than the purge pressure Pb. The standby pressure Pc may be set to be equal to an atmospheric pressure.

In Step S07, the blade mechanism 115 moves to the wiping position and the ejection surface of the ink jet head 5 is wiped using the same method as the above-mentioned wiping method. Specifically, the cleaning unit 61 moves to the retracting position while driving the blower 135. Accordingly, it is possible to wipe the ejection surface of the ink jet head 5 using the blades 121 and 122 while removing ink attached to the blades 121 and 122 or the ejection surface. In Step S07, the pressure in the ejection channels 43 is kept at the standby pressure Pc. Accordingly, after the wiping is performed using the blade mechanism 115, the ink is kept in a state in which ink swells from the nozzle holes 31 and 32.

In Step S08, the blade mechanism 115 moves to the immersing position again.

In Step S09, the cleaning unit 61 moves to the opposing position.

In Step S10, the cap unit 66 moves to the carriage capping position using the same method as the above-mentioned carriage capping method. Specifically, by causing the carriage 21 to move from the wiping standby position to the outside in the Y direction, the cap unit 66 moves upward while moving to the outside in the Y direction along with the carriage 21. Accordingly, the carriage cap 78 covers the carriage 21 from the downside and covers the nozzle holes 31 and 32 of all the ink jet heads 5 from the downside.

In Step S11, the cap unit is held at the carriage capping position for a predetermined time (for example, 60 seconds). At this time, spitting (an operation of forcibly ejecting ink) or tickling (an operation of transforming the driving walls 45 to an extent not to eject ink) may be performed.

Thereafter, in Step S12, the pressure in the ejection channels 43 is returned to the meniscus pressure Pa.

In this way, the routine ends. The routine may ends in a state in which the pressure in the ejection channels 43 is kept at the standby pressure Pc.

As described above, in this embodiment, the blade mechanism 115 includes the first blade 121 and the second blade 122 that are formed into plate shapes and the blower 135 that makes the first suction chamber 125 which is defined by the first blade 121 and the second blade 122 into a negative pressure.

According to this configuration, by bringing the first blade 121 and the second blade 122 into sliding contact with the ejection surface in a state in which the first suction chamber 125 defined by the first blade 121 and the second blade 122 is kept at a negative pressure, it is possible to wipe the ejection surface while suctioning ink attached to the first blade 121 and the second blade 122 or the ejection surface into the first suction chamber 125. Accordingly, it is possible to satisfactorily remove ink attached to the ejection surface and to maintain ejection performance of the ink jet head 5.

Particularly, by causing the first blade 121 and the second blade 122 having a plate shape to define the first suction chamber 125, it is possible to improve machining easiness and to achieve a decrease in costs in comparison with a configuration in which a suction channel is formed in a base as in the related art.

In this embodiment, since the tips of the first blade 121 and the second blade 122 are separated from each other to open the first suction chamber 125 with bending deformation at the time of wiping, it is possible to prevent foreign substance or the like from invading the first suction chamber 125 at the time of non-wiping. Accordingly, it is possible to improve maintenance of the blade unit 67.

In this embodiment, the blade mechanism 115 is movable between the wiping position and the immersing position. Accordingly, when the cleaning unit 61 is returned from the retracing position to the opposing position after the ejection surface is wiped, it is possible to suppress interference of the blade mechanism 115 with the ink jet head 5. As a result, it is possible to prevent ink attached to the blade mechanism 115, for example, in a wiping operation from being attached again to the ink jet head 5 at the time of returning.

In this embodiment, by immersing the first blade 121 and the second blade 122 in the cleaning solution in the blade pool 111 at the immersing position, it is possible to clean the first blade 121 and the second blade 122 and to remove ink or the like attached to the first blade 121 and the second blade 122.

In this embodiment, since the float sensor 116 that detects the liquid level in the blade pool 111 is provided, it is possible to keep the cleaning solution at a desired liquid level. Accordingly, it is possible to satisfactorily remove ink or the like attached to the first blade 121 and the second blade 122 at the separating position.

In this embodiment, the pressure in the first suction chamber 125 is made into a negative pressure using the second suction chamber 132 formed in the blade frame 110 and the connecting tube 127.

According to this configuration, since suctioned ink or the like can be stored in the second suction chamber 132, it is possible to reduce, for example, a maintenance frequency.

In this embodiment, since the communication of the first suction chamber 125 and the second suction chamber 132 via the connecting tube 127 is intercepted at the immersing position, it is possible to prevent the cleaning solution in the blade pool 111 from flowing into the first suction chamber 125.

In this embodiment, since the baffle plate 136 is disposed between the suction hole 133 and the second communication hole 130, ink or the like flowing into the second suction chamber 132 via the second communication hole 130 collides with the baffle plate 136 in the course of flowing to the suction hole 133. Accordingly, it is possible to prevent ink or the like flowing into the second suction chamber 132 from being attached to the blower 135 or being discharged to the outside via the suction hole 133 or the blower 135. As a result, it is possible to collect the ink or the like flowing into the second suction chamber 132 in the second suction chamber 132 and to efficiently store the ink or the like in the second suction chamber 132.

In this embodiment, since the blade mechanism 115 (the first blade 121 and the second blade 122) is provided to correspond to each ink jet head 5, it is possible to satisfactorily wipe the ejection surface of each ink jet head 5.

In this embodiment, the blade unit 67 and the cap unit 66 are arranged in the sub scanning direction (the X direction) perpendicular to the main scanning direction (the Y direction) of the ink jet head 5 and are configured to be movable in the X direction together.

According to this configuration, the ejection surface of the ink jet head 5 can be wiped by bringing the blade mechanism 115 into sliding contact with the ejection surface of the ink jet head 5 in the course of movement of the cleaning unit 61 in the X direction. Particularly, in comparison with a configuration in which the blade unit 67 and the cap unit 66 are arranged in the Y direction as in the related art, it is possible to decrease the size in the Y direction of the printer 1. In this case, even when the blade mechanism 115 is provided to correspond to a plurality of ink jet heads 5 arranged in the Y direction, it is possible to suppress an increase in size of the printer 1. Accordingly, it is possible to provide a printer 1 with a small size and with a short cleaning time.

In this embodiment, since the cleaning device 6 is employed, it is possible to provide a printer 1 with high reliability at a low cost.

Second Embodiment

Figure 19:
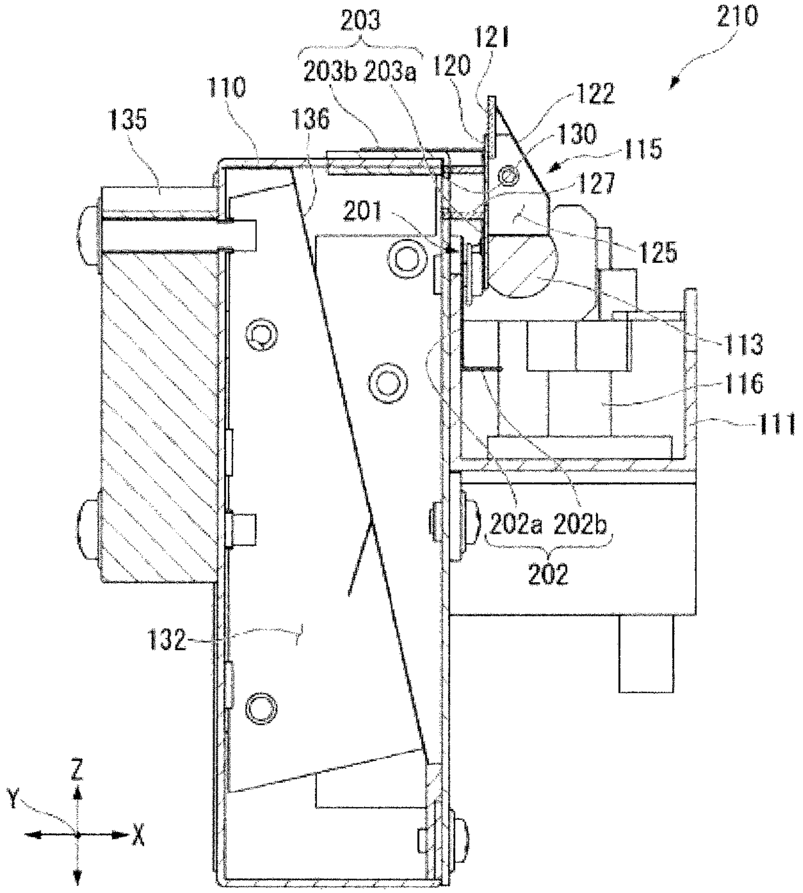
FIG. 19 is a cross-sectional view illustrating a state in which a blade mechanism of a blade unit according to a second embodiment is located at a wiping position.

A second embodiment of the invention will be described below. FIG. 19 is a cross-sectional view of a blade unit 210 (at the wiping position) according to the second embodiment. In the following description, the same elements as in the above-mentioned embodiment may be referenced by the same reference numerals and description thereof may not be repeated.

The blade unit 210 illustrated in FIG. 19 includes a shutter mechanism 201 that opens and closes the blade pool 111.

The shutter mechanism 201 includes a fixed shutter 202 and a rotary shutter 203.

The fixed shutter 202 is formed in an L shape in a cross-sectional view. Specifically, the fixed shutter 202 includes a fixed portion 202*a* extending in the Z direction and a flange portion 202*b* extending in the X direction. The fixed portion 202*a* is fixed to one side wall portion located on one side in the X direction in the blade pool 111. The flange portion 202*b* extends from the lower end of the fixed portion 202*a* to the other side in the X direction. The flange portion 202*b* covers a part of the blade pool 111 (on one side in the X direction) from the upside. The extending distance in the X direction of the flange portion 202*b* is set to such a length not to interfere with the second blade 122 when the blade mechanism 115 is located at the immersing position.

The rotary shutter 203 opens and closes the upper opening of the blade pool 111 with rotation of the blade mechanism 115. The rotary shutter 203 is formed in an L shape in a cross-sectional view. Specifically, the rotary shutter 203 includes a fixed portion 203*a* extending in the Z direction and a flange portion 203*b* extending in the X direction. The fixed portion 203*a* is fixed to the blade holder 120. The flange portion 203*b* extends on one side in the X direction from the upper end of the fixed portion 203*a*.

Figure 20:
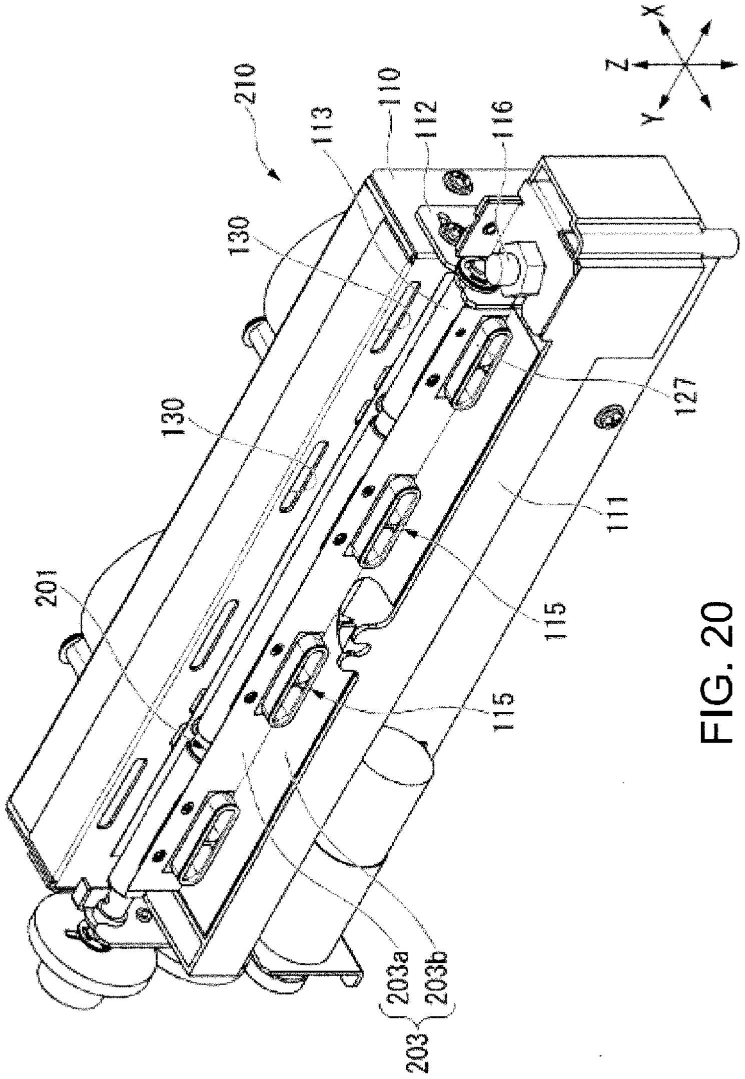
FIG. 20 is a perspective view of the blade unit illustrating a state in which the blade mechanism is located at an immersing position.
Figure 21:
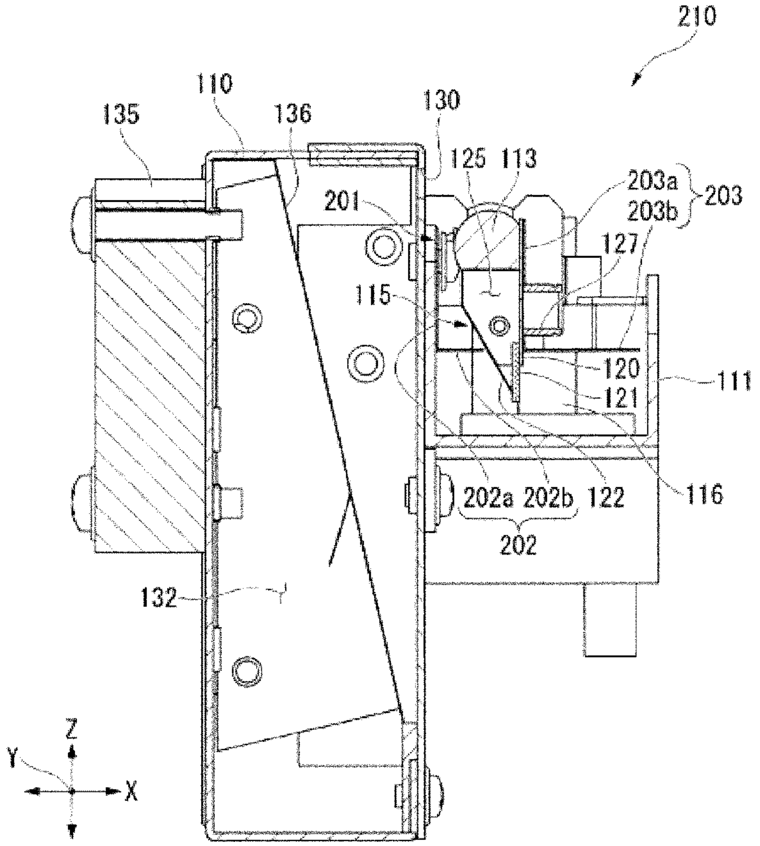
FIG. 21 is a cross-sectional view illustrating a state in which the blade mechanism is located at the immersing position and corresponding to FIG. 19.

FIG. 20 is a perspective view of a blade unit 210 illustrating a state in which the blade mechanism 115 is located at the immersing position. FIG. 21 is a cross-sectional view illustrating a state in which the blade mechanism 115 is located at the immersing position and corresponding to FIG. 19.

As illustrated in FIGS. 20 and 21, the rotary shutter 203 rotates about the support shaft 113 along with the blade mechanism 115 with the rotating operation of the blade mechanism 115. In this embodiment, when the blade mechanism 115 is located at the wiping position illustrated in FIG. 19, the flange portion 203*b* of the rotary shutter 203 is located above the blade frame 110. When the blade mechanism 115 is located at the immersing position illustrated in FIGS. 20 and 21, the flange portion 203*b* of the rotary shutter 203 is located inside the blade pool 111. Accordingly, the flange portion 203*b* of the rotary shutter 203 closes the blade pool 111 along with the flange portion 202*b* of the fixed shutter 202.

As described above, in this embodiment, the blade unit 210 includes the shutter mechanism 201 that opens the blade pool 111 at the wiping position and closes the blade pool 111 in a state in which the blades 121 and 122 are immersed in the cleaning solution at the immersing position.

According to this configuration, by closing the blade pool 111 using the shutter mechanism 201, for example, it is possible to suppress volatilization of the cleaning solution. For example, when UV-curable ink is used, it is possible to prevent UV light emitted after ejection of ink from entering the blade pool 111. Accordingly, it is possible to prevent ink mixed into the cleaning solution or ink attached to the blades 121 and 122 from being cured in a UV light irradiation process after ejection of ink.

The technical scope of the invention is not limited to the above-mentioned embodiments, but various modifications can be modified without departing from the gist of the invention.

For example, in the above-mentioned embodiments, the ink jet printer 1 has been described as an example of the liquid ejection device, but the liquid ejection device is not limited to the printer. For example, a facsimile or an on-demand printer may be used.

In the above-mentioned embodiments, a double-line ink jet head in which nozzle holes 31 and 32 are arranged in two lines has been described, but the invention is not limited thereto. For example, an ink jet head having three or more nozzle holes may be employed or an ink jet head having one line of nozzle holes may be employed.

In the above-mentioned embodiments, an edge shoot type ink jet head 5 has been described as an example, but the invention is not limited to this configuration. That is, the ink jet head 5 may be of a so-called side shoot type in which ink is ejected from a central portion in the channel extending direction of an ejection channel.

In the above-mentioned embodiments, a configuration in which the channels 43 and 44 are formed in a linear shape in the Z direction has been described, but the invention is not limited to this configuration. The channels may extend in a direction intersecting the Z direction.

In the above-mentioned embodiments, a so-called off-carriage printer 1 in which the ink tank 13 is mounted separately from the carriage 21 (housing 7) has been described, but the invention is not limited to this configuration. That is, a so-called on-carriage printer in which the ink tank is mounted on the carriage 21 may be employed. In the off-carriage type, a sub tank may be mounted on the carriage 21.

Figure 22:
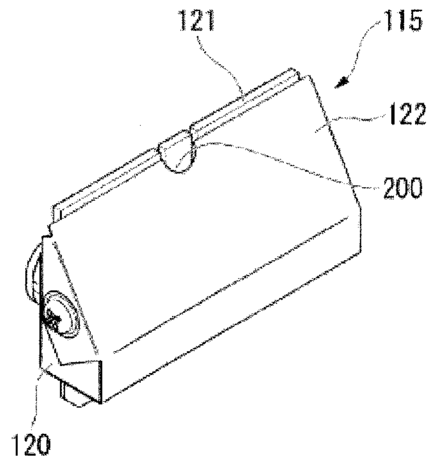
FIG. 22 is a perspective view illustrating a modified example of the blade mechanism.

Like the blade mechanism 115 illustrated in FIG. 22, the tip of the first blade 121 may be divided into a portion for wiping the nozzle arrays 56 and 57 and a portion for wiping the nozzle guard 37. According to this configuration, even when the ejection surface of the ink jet head 5 is an uneven surface, the blade mechanism 115 can be brought into uniform contact with the convex portion including the bottom surface of the nozzle guard 37 and the concave portion including the bottom surface of the nozzle plate 35. Accordingly, it is possible to satisfactorily wipe the entire ejection surface.

A concave portion 200 which is recessed in a direction in which it is separated from the first blade 121 may be formed in a portion of the tip of the second blade 122 corresponding to the nozzle arrays 56 and 57. According to this configuration, since ink attached to the peripheries of the nozzle arrays 56 and 57 on the ejection surface can be efficiently suctioned, it is possible to suppress deterioration in ejection performance due to the ink attached to the ejection surface.

Figure 23:
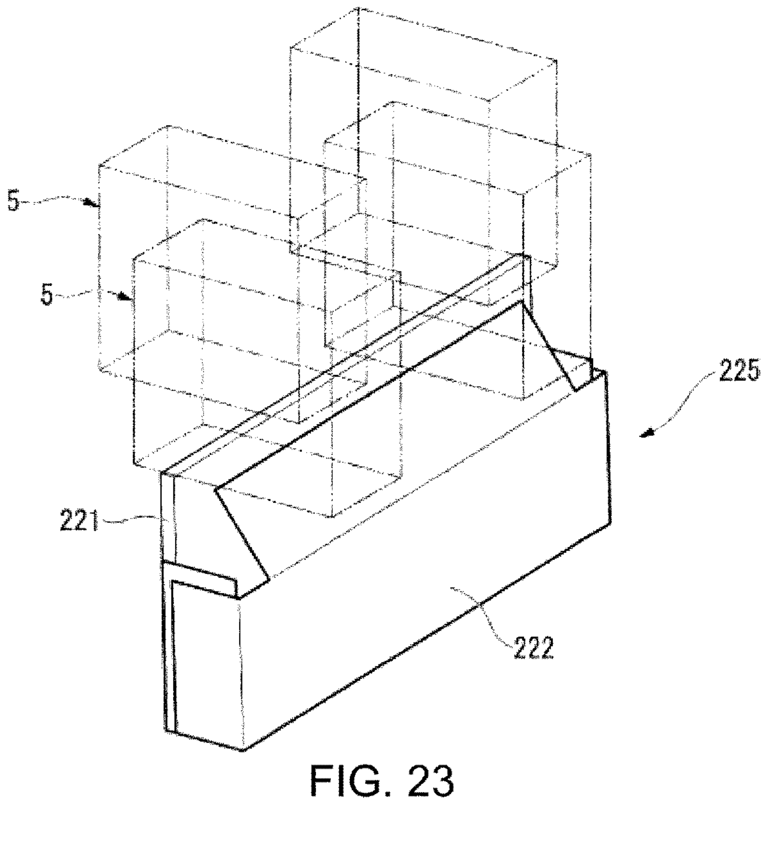
FIG. 23 is a perspective view illustrating a modified example of the blade mechanism.
Figure 24:
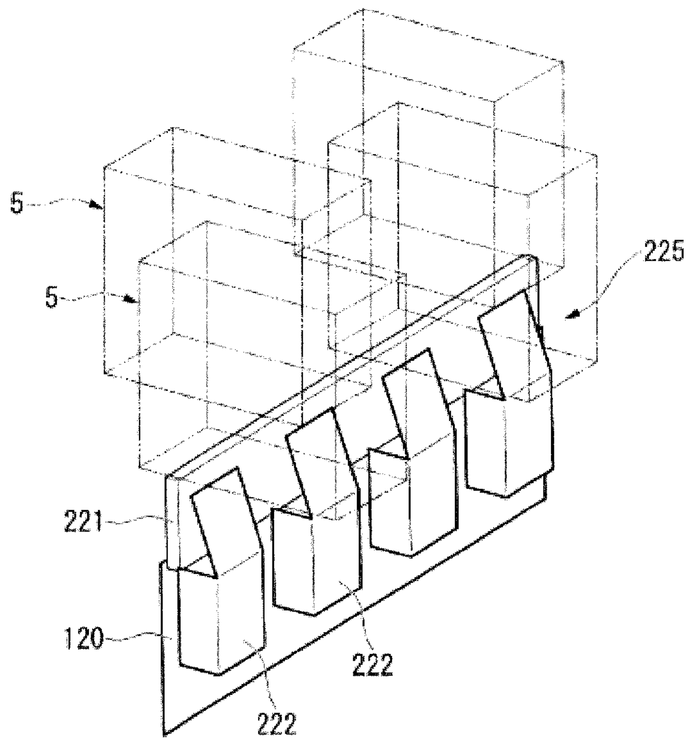
FIG. 24 is a perspective view illustrating a modified example of the blade mechanism.

In the above-mentioned embodiments, a configuration in which the blades 121 and 122 of the blade mechanism 115 are provided to correspond to each ink jet head 5 has been described, but the invention is not limited to this configuration. That is, at least one blade of the blades may be formed in a length capable of simultaneously wiping a plurality of ink jet heads 5. In this case, for example, like a blade mechanism 225 illustrated in FIG. 23, blades 221 and 222 may be formed in a length capable of simultaneously wiping the ink jet heads 5. As illustrated in FIG. 24, the first blade 221 is formed in a length capable of simultaneously wiping the ink jet heads 5 and the second blade 222 may be provided for each ink jet head 5. The blades may be formed in a length capable of wiping two or more of all the ink jet heads 5.

According to this configuration, it is possible to achieve a decrease in the number of components or simplification of a configuration in comparison with a case in which the blades are provided for each ink jet head 5.

In the above-mentioned embodiments, a configuration in which the blade mechanism moves to the wiping position and the immersing position by rotating the blade mechanism about the support shaft 113 has been described, but the invention is not limited to this configuration. The blade mechanism may perform, for example, a sliding operation as long as it moves in the Z direction between the wiping position and the immersing position.

In the above-mentioned embodiments, a configuration in which the first suction chamber 125 is made into a negative pressure via the second suction chamber 132 has been described, but the invention is not limited to this configuration. The first suction chamber 125 may be directly made into a negative pressure.

In the above-mentioned embodiments, a configuration in which the cap unit 66 includes the carriage capping mechanism 73 and the head capping mechanism 75 has been described, but the invention is not limited to this configuration as long as the cap unit includes at least one of the carriage capping mechanism 73 and the head capping mechanism 75. The cap unit 66 is not limited to the carriage capping mechanism 73 and the head capping mechanism 75, as long as it can cap the ejection (come in contact with the ejection surface or cover the nozzle holes 31 and 32) for the purpose of maintenance or recovery of ejection performance of the nozzle holes.

Without departing from the gist of the invention, elements in the above-mentioned embodiments may be appropriately replaced with known elements and the above-mentioned modified examples can be appropriately combined.

What is claimed is:

1. A cleaning device of a liquid ejection head, the cleaning device comprising:

a blade unit configured to move relative to the liquid ejection head and to wipe an ejection surface of the liquid ejection head in which ejection holes are opened, wherein the blade unit includes a first blade and a second blade that are arranged in a moving direction of the blade unit and each formed to have a flexible plate shape, and a suction mechanism that applies negative pressure in an inner space defined by the first blade and the second blade, and further wherein the blade unit further includes:

a blade frame that supports the first blade and the second blade and defines a suction chamber, and a connecting portion that connects the inner space to the suction chamber so as to communicate with each other, and the suction mechanism is disposed in the blade frame and applies the negative pressure to the inner space via the suction chamber and the connecting portion so that liquid is suctioned from the liquid ejection head into the suction chamber where the suctioned liquid is stored.

2. The cleaning device of the liquid ejection head according to claim 1, wherein the blade unit is configured such that tips of the first blade and the second blade come in contact with each other so as to close the inner space during non-wiping, while the first blade and the second blade are bent during wiping and the tips thereof are separated from each other so as to open the inner space.

3. The cleaning device of the liquid ejection head according to claim 1, wherein the blade unit is movable between a wiping position at which the first blade and the second blade are in contact with the ejection surface and wipe the ejection surface and a separating position at which the first blade and the second blade are situated apart from the ejection surface.

4. The cleaning device of the liquid ejection head according to claim 3, wherein the blade unit further includes a blade pool in which a cleaning solution is contained, and the first blade and the second blade are immersed in the cleaning solution at the separating position.

5. The cleaning device of the liquid ejection head according to claim 4, wherein the blade unit further includes a shutter mechanism that opens the blade pool at the wiping position and closes the blade pool when the first blade and the second blade are immersed in the cleaning solution at the separating position.

6. The cleaning device of the liquid ejection head according to claim 4, further comprising a float sensor that detects a liquid level of the cleaning solution contained in the blade pool.

7. The cleaning device of the liquid ejection head according to claim 1, wherein the blade unit is configured such that the inner space and the suction chamber communicate with each other via the connecting portion at the wiping position and communication between the inner space and the suction chamber via the connecting portion is intercepted at the separating position.

8. The cleaning device of the liquid ejection head according to claim 1, wherein the blade frame is provided with a baffle plate that is disposed between the connecting portion and the suction mechanism in the suction chamber.

9. The cleaning device of the liquid ejection head according to claim 1, wherein a plurality of the liquid ejection heads are arranged in a first direction perpendicular to the moving direction in a tangential direction of the ejection surface and are mounted on a carriage, and the first blade and the second blade are disposed so as to correspond to the plurality of liquid ejection heads.

10. The cleaning device of the liquid ejection head according to claim 1, wherein the plurality of liquid ejection heads are arranged in a first direction perpendicular to the moving direction in a tangential direction of the ejection surface and are mounted on a carriage, and a length in the first direction of at least one of the first blade and the second blade is set to simultaneously wipe the plurality of liquid ejection heads.

11. The cleaning device of the liquid ejection head according to claim 1, further comprising:

a cap unit that caps the ejection holes, wherein the blade unit and the cap unit are movable together in a sub scanning direction intersecting a main scanning direction of the liquid ejection head.

12. The cleaning device of the liquid ejection head according to claim 1, wherein the blade unit is further pressed within a range from 0.5 mm to 3.0 mm against the ejection surface in a normal direction of the ejection surface during wiping after the blade unit comes in contact with the ejection surface.

13. A liquid ejection device comprising:

a liquid ejection head that is movable in a main scanning direction; and the cleaning device according to claim 1.

* * * * *